(12) United States Patent
Wada et al.

(10) Patent No.: US 6,388,520 B2
(45) Date of Patent: May 14, 2002

(54) SEMICONDUCTOR INTEGRATED CIRCUIT

(75) Inventors: Kazuyuki Wada; Shigetaka Takagi; Nobuo Fujii, all of Tokyo (JP)

(73) Assignee: Semiconductor Technology Academic Research Center, Tokyo (JP)

( * ) Notice: Subject to any disclaimer, the term of this patent is extended or adjusted under 35 U.S.C. 154(b) by 0 days.

(21) Appl. No.: 09/741,953

(22) Filed: Dec. 19, 2000

(30) Foreign Application Priority Data

Dec. 27, 1999 (JP) .......................................... 11-370603

(51) Int. Cl.⁷ ................................................ H03F 3/45
(52) U.S. Cl. ....................... 330/253; 330/257; 330/261; 330/311
(58) Field of Search ................................. 330/253, 257, 330/261, 311

(56) References Cited

U.S. PATENT DOCUMENTS 5,936,466 A * 8/1999 Andoh et al. ............... 330/253
6,064,262 A * 5/2000 Wang .......................... 330/253
6,177,837 B1 * 1/2001 Aoki et al. .................. 330/311

OTHER PUBLICATIONS

J–P. Eggermont et al., "Potential and Modeling of 1–μm SOI CMOS Operational Transconductance Amplifiers for Applications up to 1 GHz," IEEE Journal of Solid–State Circuits, vol. 33, No. 4., Apr. 1998.
E. Ibaragi et al., "A Method to Improve CMRR for CMOS Operational Amplifier by Using Feedforward Technique," IEICE Trans. Fundamentals, vol. E80–A, No. 2, Feb. 1997.

* cited by examiner

Primary Examiner—Michael B Shingleton
(74) Attorney, Agent, or Firm—Christensen O'Connor Johnson Kindness PLLC

(57) ABSTRACT

A semiconductor integrated circuit comprises an amplifier circuit including a current output amplifier, a load resistor having one end connected to an output terminal of the current output amplifier and a voltage control circuit having an input terminal connected to the one end of the load resistor and an output terminal connected to an other end of the load resistor. The input terminal of the amplifier circuit serves as an input terminal of the current output amplifier, and the output terminals of the amplifier circuit serve as the individual ends of the load resistor.

23 Claims, 21 Drawing Sheets

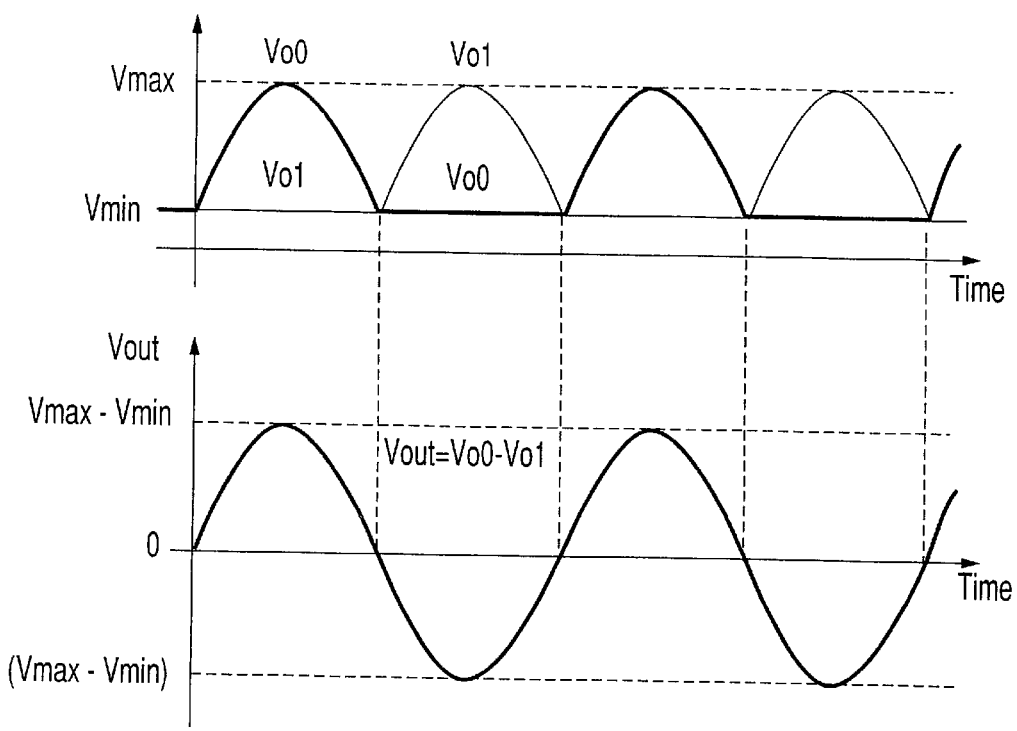
FIG. 5
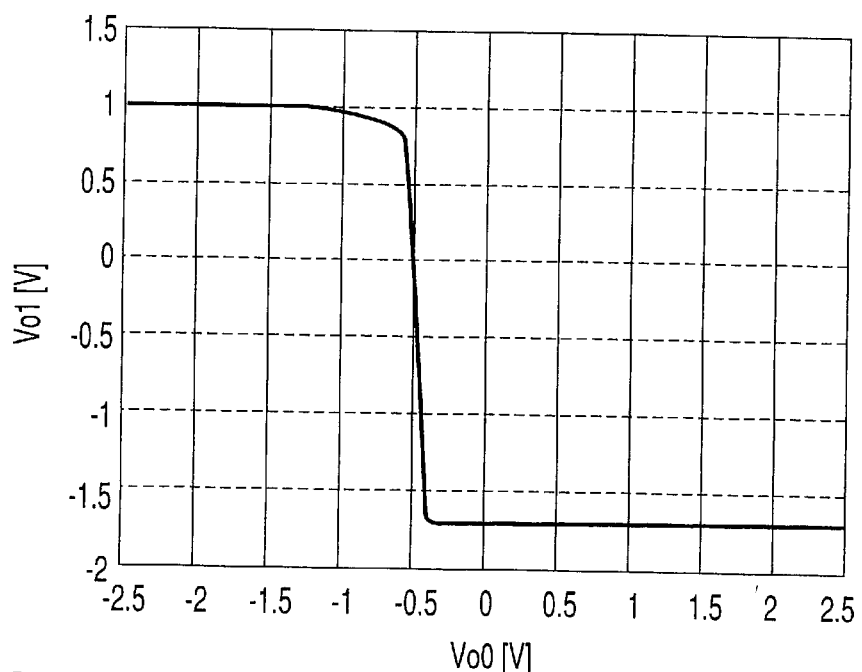
FIG. 7   VDD=VSS=2.5V,Vmin0=-0.5V,Vmin1=-1.7V

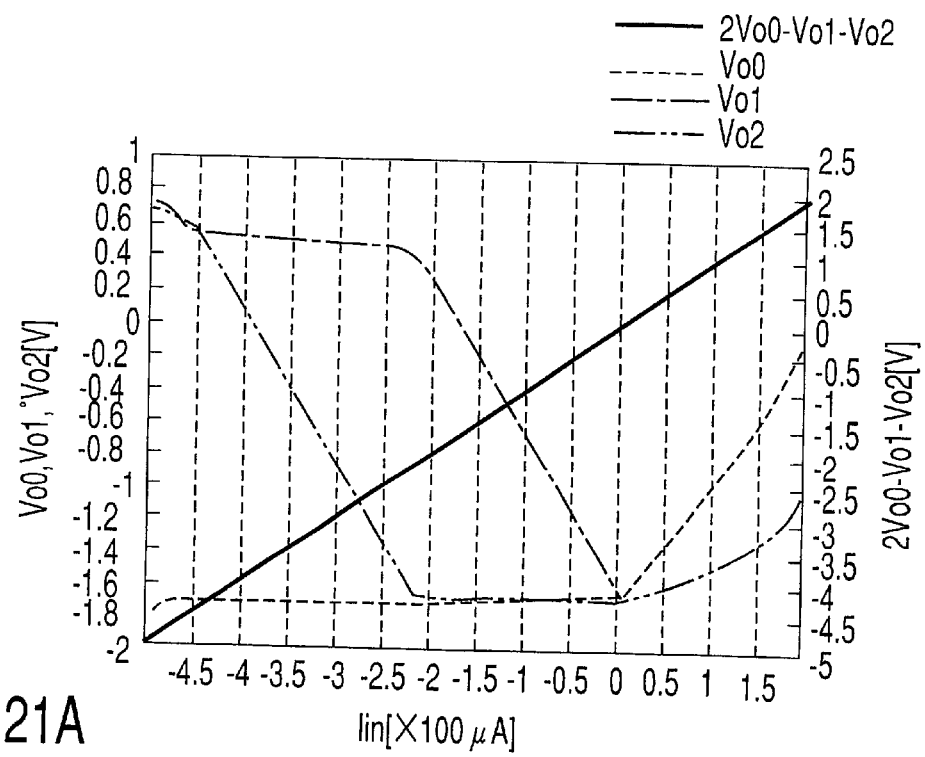
F I G. 21A
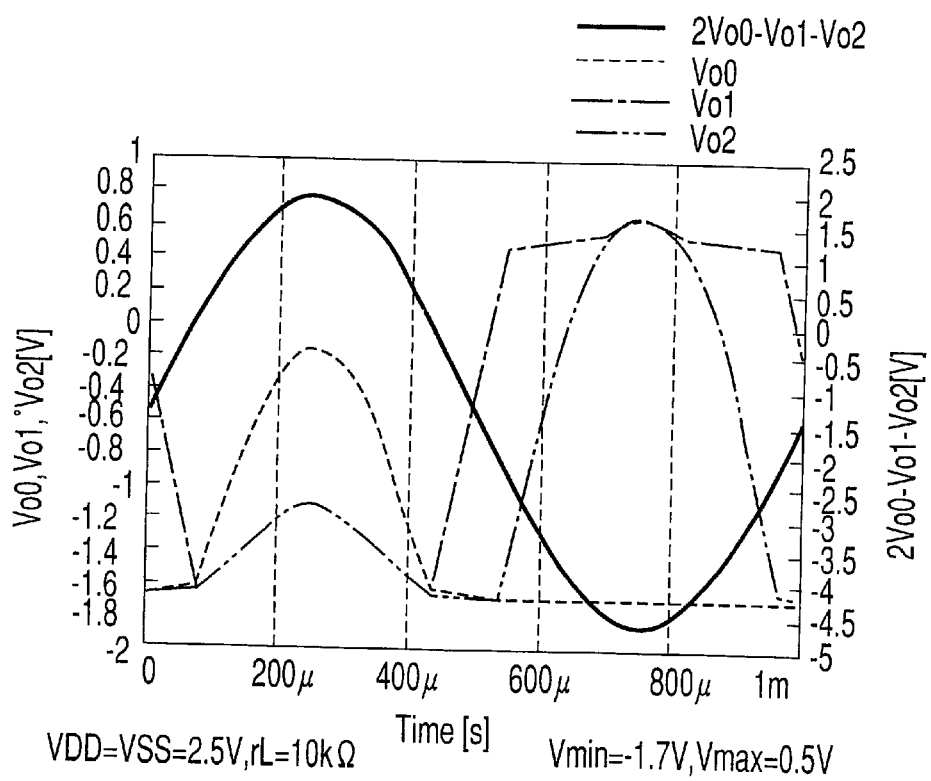
F I G. 21B

SEMICONDUCTOR INTEGRATED CIRCUIT

CROSS-REFERENCE TO RELATED APPLICATIONS

This application is based upon and claims the benefit of priority from the prior Japanese Patent Application No. 11-370603, filed Dec. 27, 1999, the entire contents of which are incorporated herein by reference.

BACKGROUND OF THE INVENTION

The present invention relates to a semiconductor integrated circuit, and, more particularly, to a semiconductor integrated circuit with an amplifier circuit which has a wide dynamic range even for a low voltage source.

As the microminiaturization of the semiconductor process progresses, the state-of-the-art LSI circuit technology is demanded of a faster operational speed of integrated circuits, lower power consumption and lower supply voltages. While the improvement on the operational speed and the reduction in power consumption have been accomplished by the device technology, the circuit performance in lower supply voltages cannot be guaranteed by the device technology and should be achieved by the circuit technology.

In analog circuits, particularly, as the supply voltages become lower, it becomes difficult to improve the signal dynamic range and secure the good S/N (signal to noise) ratio. For example, a conventional amplifier circuit in a semiconductor integrated circuit shown in FIG. 1A comprises a basic OTA (Operational Transconductance Amplifier) 1 and a load resistor 2 as shown in FIG. 2. Given that the mutual conductance of the OTA 1 is gm, the amplifier circuit outputs current i (=gm·Vin) proportional to an input voltage Vin. The current i is supplied to the load resistor 2 and Vin is amplified by gm·rL, yielding an amplified output voltage Vout.

The amplitude of the output voltage Vout that appears at an output terminal 101 is generally limited to (Vmax−Vmin) by voltage values Vmax and Vmin according to supply voltages ($V_{DD}$, $-V_{SS}$) as shown in FIG. 1B. Therefore, the reduction in supply voltages reduces the dynamic range of an analog signal Vout, thus making it difficult to secure the performance of the amplifier circuit.

Conventionally, various attempts have been made to reduce the supply voltages. The attempts include the generation of a high voltage by a booster circuit (DC-DC converter, boost trap circuit or the like), and designing a folded type circuit or a low-voltage circuit which uses MOS transistors having a low threshold value. The booster circuit raises a problem of a breakdown voltage in the microminiaturization or sub-micron process. The folded type circuit generally suffers a complicated circuit design. MOS transistors with a low threshold value often produce a leak current which should be coped with. Those techniques often stand in the way of designing an analog circuit into an integrated circuit in the microminiaturization process, and do not always provide a solution to securing the dynamic range in analog signal processing.

Apparently, as the supply voltages become lower, it becomes difficult to improve the signal dynamic range and secure the good S/N ratio in accordance with the reduction in supply voltages. In an amplifier circuit, particularly, the reduction in supply voltages reduces the dynamic range of an analog signal. This makes it difficult to secure the performance of the amplifier circuit.

BRIEF SUMMARY OF THE INVENTION

It is an object of the present invention to provide a semiconductor integrated circuit that can realize an amplifier circuit having a wide effective dynamic range even for low supply voltages and that can realize an amplifier circuit having a wide dynamic range using the ordinary CMOS semiconductor circuit technology.

According to a first aspect of this invention, there is provided a semiconductor integrated circuit for a low supply voltage, which comprises an amplifier circuit including a current output type amplifier converting an input signal to a current signal, a load resistor having one end connected to an output terminal of the current output type amplifier and a voltage control circuit having an input terminal connected to the one end of the load resistor and an output terminal connected to the other end of the load resistor, an input terminal of the amplifier circuit serving as an input terminal of the current output type amplifier, output terminals of the amplifier circuit serving as the individual ends of the load resistor.

The following are preferable embodiments of the first aspect of the invention.

(1) The voltage control circuit comprises a first functional circuit which fixes an output voltage to a preset first constant voltage when an input voltage is higher than the first constant voltage and operates as an inverting operational amplifier when the input voltage is lower than the first constant voltage.

(2) The voltage control circuit comprises a second functional circuit which fixes an output voltage to a preset second constant voltage when an input voltage is lower than the second constant voltage and operates as an inverting operational amplifier when the input voltage is higher than the second constant voltage.

(3) The voltage control circuit comprises a third functional circuit which operates as an inverting operational amplifier.

According to a second aspect of this invention, there is provided a semiconductor integrated circuit for a low supply voltage, which comprises an amplifier circuit including a current output type amplifier converting an input signal to a current signal, a first resistor having one end connected to an output terminal of the current output type amplifier, a first voltage control circuit having an input terminal connected to the one end of the first resistor, a second resistor having one end connected to the output terminal of the current output type amplifier, and a second voltage control circuit having an input terminal connected to the one end of the second resistor and an output terminal connected to the other end of the second resistor. The amplifier circuit has an input terminal serving as an input terminal of the current output type amplifier and output terminals serving as the output terminal of the current output type amplifier and the other ends of the first and second resistors.

The second aspect of the present invention may take the form of the following preferable embodiment.

The second voltage control circuit comprises a first functional circuit which fixes an output voltage to a preset first constant voltage when an input voltage is higher than the first constant voltage and operates as an inverting operational amplifier when the input voltage is lower than the first constant voltage, and the first voltage control circuit is constituted by a second functional circuit which fixes the output voltage to a preset second constant voltage higher than the first constant voltage when the input voltage is lower than the second constant voltage and operates as an inverting operational amplifier when the input voltage is higher than the second constant voltage.

According to a third aspect of this invention, there is provided a semiconductor integrated circuit for a low supply voltage, which comprises an amplifier circuit including a current output type amplifier converting an input signal to a current signal, a first resistor having one end connected to an output terminal of the current output type amplifier, a first voltage control circuit having an input terminal connected to the one end of the first resistor, a second resistor having one end connected to the output terminal of the current output type amplifier, and a third voltage control circuit having an input terminal connected to the other end of the first resistor and an output terminal connected to the other end of the second resistor. The amplifier circuit has an input terminal serving as an input terminal of the current output type amplifier and output terminals serving as the output terminal of the current output type amplifier and the other ends of the first and second resistors.

The following are preferable embodiments of the third aspect of the invention.

(1) The first voltage control circuit comprises a first functional circuit which fixes an output voltage to a preset first constant voltage when an input voltage is higher than the first constant voltage and operates as an inverting operational amplifier when the input voltage is lower than the first constant voltage, and the third voltage control circuit is constituted by a fourth functional circuit which fixes the output voltage to the first constant voltage when the input voltage is lower than a preset second constant voltage higher than the first constant voltage and operates as a non-inverting operational amplifier when the input voltage is higher than the second constant voltage.

(2) The first voltage control circuit comprises a second functional circuit which fixes an output voltage to a preset second constant voltage when an input voltage is lower than the second constant voltage and operates as an inverting operational amplifier when the input voltage is higher than the second constant voltage. The third voltage control circuit is constituted by a fifth functional circuit which fixes the output voltage to the second constant voltage when the input voltage is higher than a preset first constant voltage lower than the second constant voltage and operates as a non-inverting operational amplifier when the input voltage is lower than the first constant voltage.

According to a fourth aspect of this invention, there is provided a semiconductor integrated circuit for a low supply voltage, which comprises an amplifier circuit including a current output type amplifier converting an input signal to a current signal, a first resistor connected to an output terminal of the current output type amplifier, a differential operational amplifier having a positive input terminal applied with a constant voltage, a negative input terminal connected to one end of the first resistor and an output terminal connected to the other end of the first resistor, a second resistor having one end connected to the output terminal of the current output type amplifier, and a third voltage control circuit having an input terminal connected to the other end of the first resistor and an output terminal connected to the other end of the second resistor, and wherein the input terminal of the amplifier circuit serves as an input terminal of the current output type amplifier, and the output terminals of the amplifier circuit serve as the output terminal of the current output type amplifier and the other ends of the first and second resistors.

The following are preferable embodiments of the fourth aspect of the invention.

(1) The third voltage control circuit comprises a fourth functional circuit which fixes an output voltage to a preset first constant voltage when an input voltage is lower than a preset second constant voltage higher than the first constant voltage and operates as a non-inverting operational amplifier when the input voltage is higher than the second constant voltage.

(2) The third voltage control circuit comprises a fifth functional circuit which fixes an output voltage to a preset second constant voltage when an input voltage is higher than a preset first constant voltage lower than the second constant voltage and operates as a non-inverting operational amplifier when the input voltage is lower than the first constant voltage.

(3) The semiconductor integrated circuit further comprises a third resistor having one end connected to the output terminal of the current output type amplifier and a fourth voltage control circuit having an input terminal connected to the other end of the second resistor and an output terminal connected to the other end of the third resistor. The output terminal of the current output type amplifier, the other ends of the first and second resistors and the other end of the third resistor serve as an output terminal of the amplifier circuit.

(4) The third and fourth voltage control circuits comprise a fourth functional circuit which fixes an output voltage to a preset first constant voltage when an input voltage is lower than a preset second constant voltage higher than the first constant voltage and operates as a non-inverting operational amplifier when the input voltage is higher than the second constant voltage.

(5) The third and fourth voltage control circuits comprise a fifth functional circuit which fixes an output voltage to a preset second constant voltage when an input voltage is higher than a preset first constant voltage lower than the second constant voltage and operates as a non-inverting operational amplifier when the input voltage is lower than the first constant voltage.

(6) The differential operational amplifier is replaced with a third functional circuit which operates as an inverting operational amplifier.

With the above-described structures, the present invention may take the forms of the following preferable embodiments.

(1) The first functional circuit comprises an operational amplifier constituted by a differential stage for applying an input voltage to one of a pair of differential inputs formed by a pair of MOS transistors of a first channel, supplying the first constant voltage to the other differential input and having a pair of MOS transistors of a second channel opposite to the first channel as a load; an output stage including a source follower comprised of an MOS transistor of the first channel and a load; and a circuit connected to an output terminal of the output stage, for fixing a voltage at the output terminal of the output stage to the first constant voltage when that voltage is lower than the first constant voltage. The inverted signal of the input voltage to the operational amplifier is output to the output terminal of the output stage.

(2) The second functional circuit comprises an operational amplifier constituted by a differential stage for applying an input voltage to one of a pair of differential inputs formed of a pair of MOS transistors of a first channel, supplying the second constant voltage to the other differential input and having a pair of MOS transistors of a second channel opposite to the first channel as a load; an output stage including a source follower comprised of an MOS transistor of the second channel and a load; and a circuit connected to an output terminal of the output stage, for fixing a voltage at the output terminal of the output stage to the second constant voltage when that voltage is higher than the second constant voltage. The inverted signal of the input voltage to the operational amplifier is output to the output terminal of the output stage.

(3) The third functional circuit comprises an inverting operational amplifier constituted by connecting an input resistor and a feedback resistor to an operational amplifier and a voltage follower connected to an input terminal of the inverting operational amplifier. The input terminal of the third functional circuit serves as an input terminal of the voltage follower and the output terminal of the third functional circuit serves as an output terminal of the inverting operational amplifier.

(4) The third functional circuit comprises an inverter comprising MOS transistors.

(5) The fourth functional circuit comprises an operational amplifier constituted by a differential stage for applying an input voltage to one of a pair of differential inputs formed of a pair of MOS transistors of a first channel, supplying the second constant voltage to the other differential input and having a pair of MOS transistors of a second channel opposite to the first channel as a load; an output stage including a source follower comprised of an MOS transistor of the first channel and a load; and a circuit connected to an output terminal of the output stage, for fixing a voltage at the output terminal of the output stage to the first constant voltage when that voltage is lower than the first constant voltage. The non-inverted signal of the input voltage to the operational amplifier is output to the output terminal of the output stage.

(6) The fifth functional circuit comprises an operational amplifier constituted by a differential stage for applying an input voltage to one of a pair of differential inputs formed of a pair of MOS transistors of a first channel, and supplying the first constant voltage to the other differential input and having a pair of MOS transistors of a second channel opposite to the first channel as a load; an output stage fabricated by a source follower comprised of an MOS transistor of the second channel and a load; and a circuit connected to an output terminal of the output stage, for fixing a voltage at the output terminal of the output stage to the second constant voltage when that voltage is higher than the second constant voltage. The non-inverted signal of the input voltage to the operational amplifier is output to the output terminal of the output stage.

(7) The individual output terminals of the amplifier circuit are connected to an A/D converter formed on the same semiconductor integrated circuit.

According to this invention, a voltage control circuit which converts and controls the voltages at the input and output terminals as needed in accordance with an input signal is provided in an amplifier circuit, so that the input/output voltage of the voltage control circuit falls within a predetermined voltage range. This makes it possible to disperse the output signal to two (or three or more) voltage ranges in a predetermined low voltage range in signal conversion. Therefore, a circuit operable on low supply voltages can amplify a signal with a wide dynamic range. Further, the output signal that is not limited to the supply voltages is obtainable. This can ensure analog signal processing with a wide effective dynamic range.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a diagram showing individual voltage waveforms of an amplifier circuit which uses the voltage control circuit in FIG. 4;

FIG. 7 is a diagram showing the simulated results of the input/output characteristics of the voltage control circuit in FIG. 6;

FIGS. 21A and 21B are diagrams showing the simulated results of the DC characteristics of the individual voltages of the amplifier circuit and the time response according to the third embodiment;

DETAILED DESCRIPTION OF THE INVENTION

The present invention will now be described in detail with reference to illustrated preferred embodiments.

First Embodiment

Figure 3:
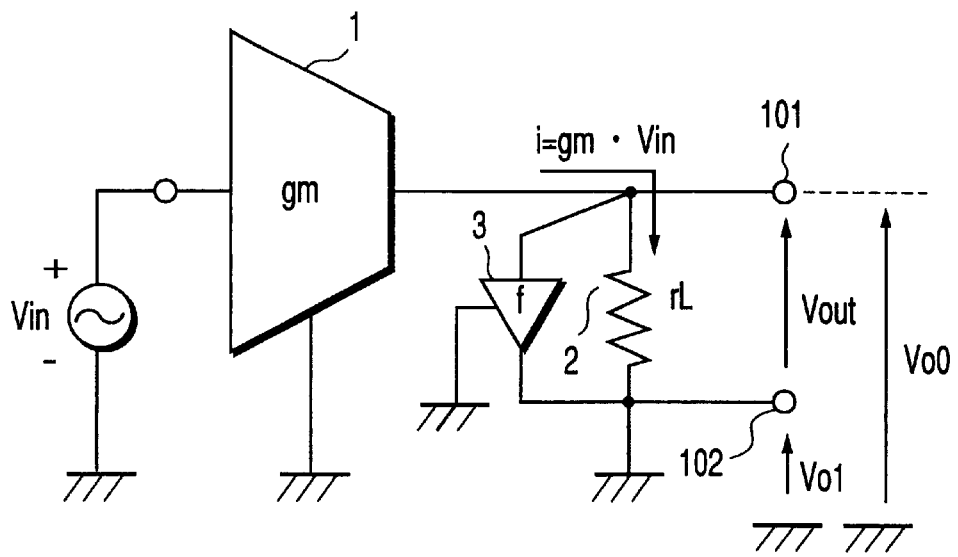
FIG. 3 is a diagram illustrating the structure of an amplifier circuit in a semiconductor integrated circuit according to a first embodiment of the present invention.

FIG. 3 is a diagram illustrating the structure of an amplifier circuit in a semiconductor integrated circuit according to the first embodiment of this invention.

An input signal Vin is input to a current output type amplifier, i.e., an operational transconductance amplifier (OTA) 1. The OTA 1 amplifies the input signal Vin, converts it to a current i and output the current i. The output terminal of the OTA 1 is connected to a first terminal 101 and one end of a load resistor 2. The other end of the load resistor 2 is connected to a second terminal 102. A voltage control circuit 3 is provided in parallel to the load resistor 2 has an input terminal on that side of the terminal 101 and an output terminal on that side of the terminal 102.

With this structure, given that the mutual conductance of the OTA 1 is gm, the current i to be output is given by $$i = gm \cdot Vin \quad (1)$$

When the current i flows across the load resistor 2 (the resistance of rL), an output voltage Vout given by the following equation appears across the load resistor 2.

$$Vout = rL \cdot i = gm \cdot rL \cdot Vin \quad (2)$$

Ideally, the voltage control circuit 3 then is a circuit whose input impedance is infinity and whose input/output terminal voltage is controlled in accordance with the voltage or current in the input section. Provided that the input voltage and output terminal voltage of the voltage control circuit 3 are denoted by Vo0 and Vo1, Vout is expressed by $$Vout = Vo0 - Vo1 \quad (3)$$

Vo0 and Vo1 are absolute voltages of the circuit. Assuming that Vo0 and Vo1 take values in the range between a maximum value Vmax and a minimum value Vmin, then $$Vmin \leq Vo0, Vo1 \leq Vmax \quad (4)$$

As Vout is a relative voltage and falls within the following range, $$Vmin - Vmax \leq Vout \leq Vmax - Vmin \quad (5)$$

the dynamic range of Vout is 2(Vmax−Vmin), twice the conventional dynamic range, whereas the dynamic range of Vo0 and Vo1 is (Vmax−Vmin).

Figure 1A:
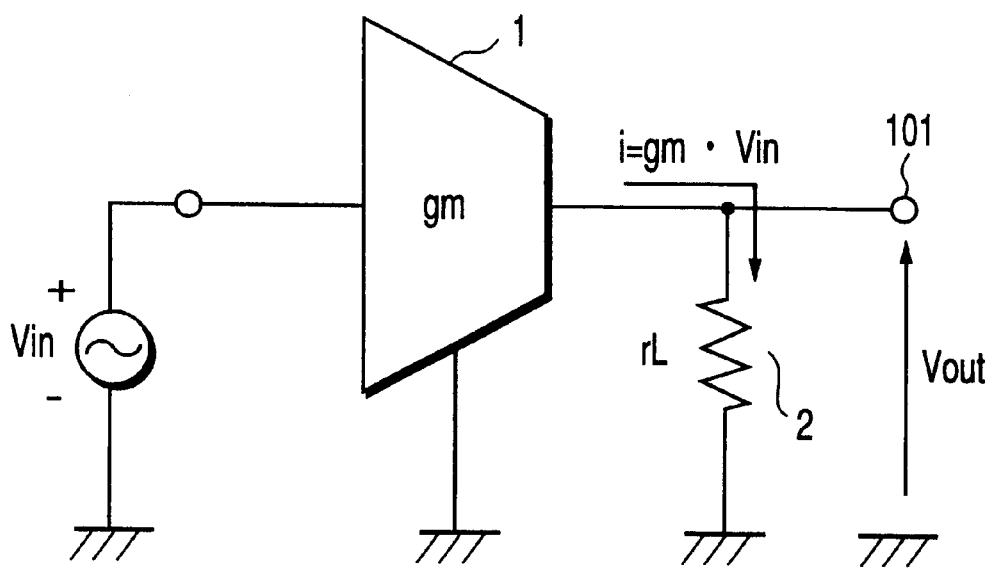
FIGS. 1A and 1B show a diagram illustrating the structure of a conventional amplifier circuit in a semiconductor integrated circuit and the dynamic range thereof.
Figure 1B:
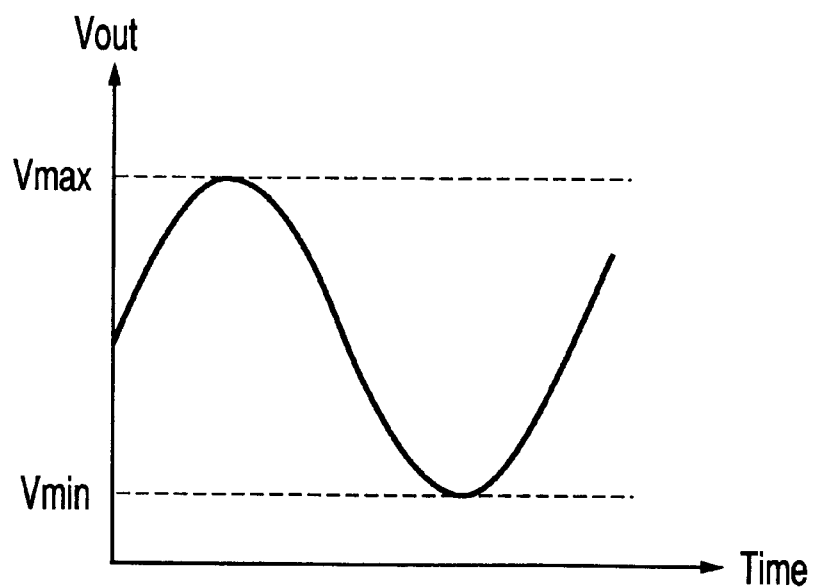
Figure 2:
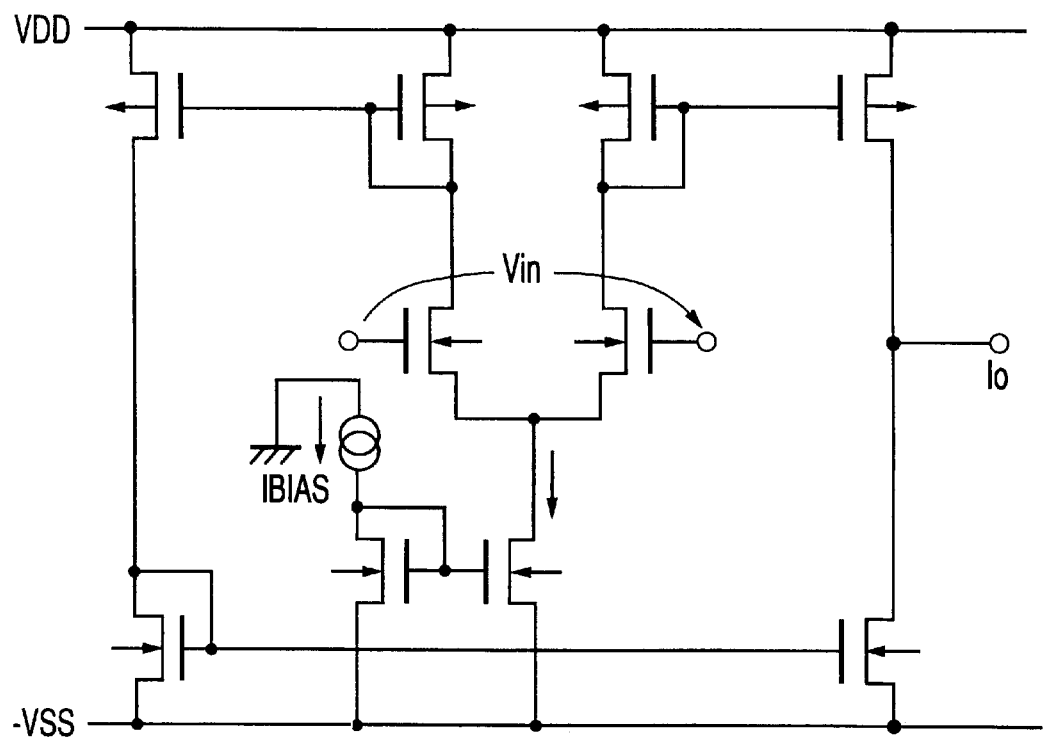
FIG. 2 is a diagram showing the structure of a basic OTA to be used in the amplifier circuit in FIG. 1A.

The conventional amplifier circuit in FIGS. 1 and 2 does not have the voltage control circuit 3 and has the other end of the load resistor 2 grounded. Therefore, the voltage Vout that appears at the output terminal 101, like the output terminal voltage Vo0, is limited to (Vmax−Vmin). By way of contrast, the output voltage Vout of the amplifier circuit of this embodiment in FIG. 3 becomes 2(Vmax−Vmin), so that the dynamic range is doubled for the same supply voltages. It is also possible to construct an amplifier circuit with an integrated circuit of low supply voltages without lowering the dynamic range.

Figure 4:
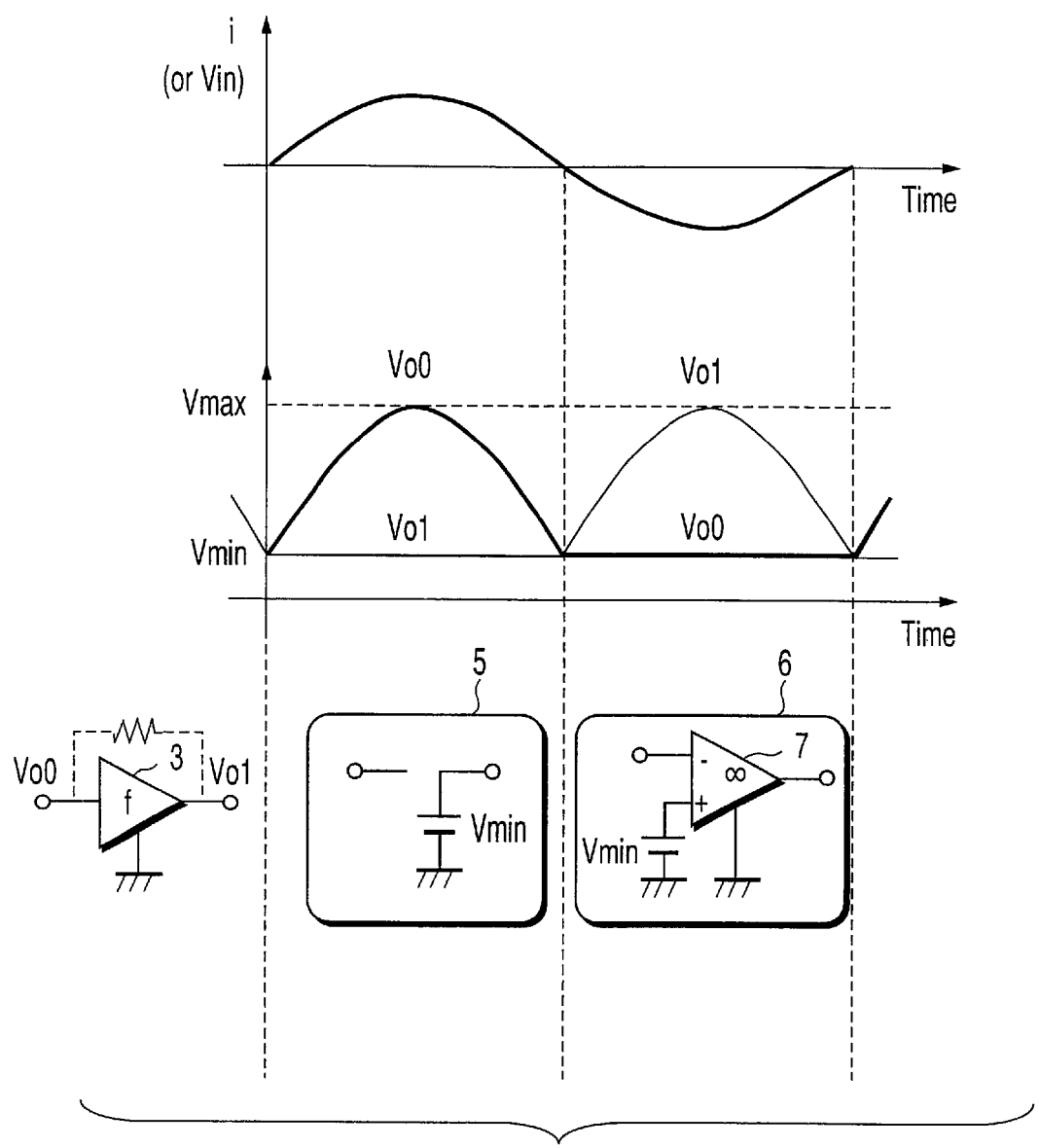
FIG. 4 is a diagram depicting the operation of a voltage control circuit used in the amplifier circuit in FIG. 3.

FIG. 4 shows an example of the operation of the voltage control circuit (first functional circuit) 3 used in the amplifier circuit of this embodiment. In FIG. 3, as the input voltage Vin increases in the positive direction, the output current i of the OTA 1 increases in the positive direction too. At this time, the current i flows across the load resistor 2 from one end 101 toward the other end 102, so that the output voltage Vout goes to a high level. The input terminal of the voltage control circuit 3 is opened or the input impedance becomes sufficiently high, and when Vo0 becomes higher than a constant voltage Vmin, the voltage control circuit 3 operates so as to set the output terminal at the constant voltage Vmin. This operation can be expressed by an equivalent circuit 5 in FIG. 4.

When the input voltage Vin drops in the negative direction, on the other hand, the output current i of the OTA 1 becomes negative. This causes the current i to flow toward the OTA 1 from the load resistor 2, so that the output voltage Vout goes to a low level. When Vo0 tends to become lower than Vmin, the input terminal of the voltage control circuit 3 is virtually fixed to the constant voltage Vmin by the feedback operation of an OPA (Operational Amplifier) 7 which is expressed by an equivalent circuit 6 in FIG. 4. As a result, the voltage control circuit 3 supplies the current i to the load resistor 2 from the output terminal. The OPA 7 has an infinite input impedance and gain, and performs the feedback operation with the load resistor 2 connected between its input and output terminals. At this time, the output resistance of the OPA 7 and noise of the output section do not directly affect the performance of the voltage control circuit 3.

The use of the voltage control circuit 3 causes the voltages Vo0 and Vo1 shown in FIG. 4 to appear at the output terminals 101 and 102 of the amplifier circuit in FIG. 3 in accordance with the input voltage Vin or the output current i. During the positive period of the output current i, Vo1 is fixed to the constant voltage Vmin as indicated by the equivalent circuit 5 and Vo0 becomes a variable voltage equivalent to the voltage drop (gm·rL·Vin) caused by the load resistor 2. The maximum value Vmax of Vo0 corresponds to the positive peak of the output current i and (Vo0−Vo1) or (Vmax−Vmin) gives the positive peak of Vout.

During the negative period of the output current i, Vo0 is fixed to the constant voltage Vmin as indicated by the equivalent circuit 6 and Vo1 becomes a variable voltage equivalent to the voltage drop (gm·rL·Vin) caused by the load resistor 2. The maximum value Vmax of Vo1 corresponds to the negative peak of the output current i and (Vo0−Vo1) or (Vmin−Vmax) gives the negative peak value of Vout. In the operation shown in FIG. 4, when the output current i is 0, the output terminal voltage Vo0 becomes Vmin (=0). As Vo1 is also Vmin (=0) at this time, the output voltage Vout becomes 0 from the equation 3.

The above-described operation causes the output voltage Vout to vary as shown in FIG. 5 so that the dynamic range becomes 2(Vmax−Vmin), twice the dynamic range (FIG. 1B) of the conventional amplifier circuit (FIG. 1A). It is assumed that Vmax and Vmin respectively represent the maximum voltage and minimum voltage of the terminal voltage (output terminal) in the amplifier circuit and the conventional amplifier circuit (FIG. 1A) and the amplifier circuit of this embodiment operate on the same supply voltages.

Figure 6:
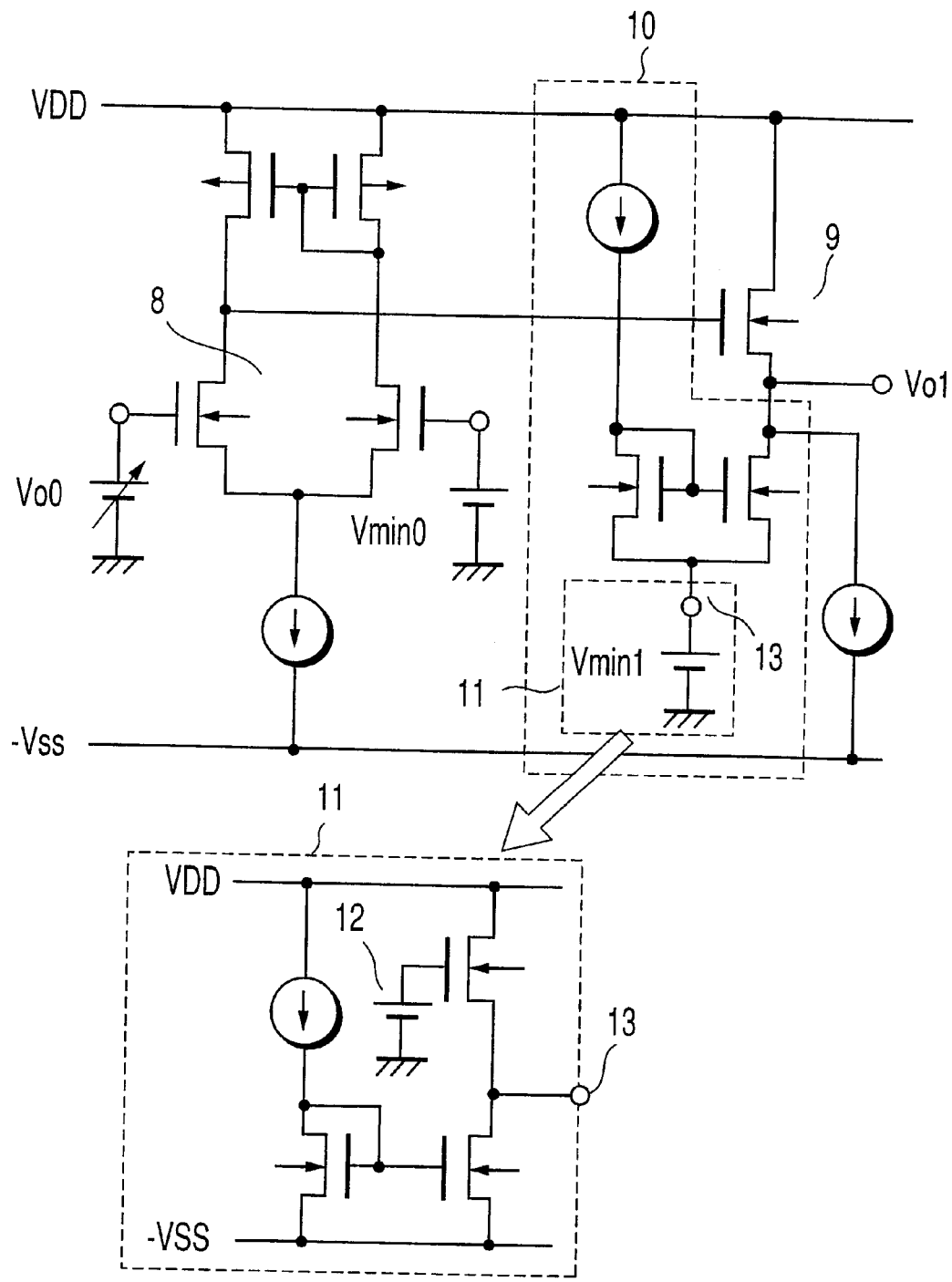
FIG. 6 is a diagram exemplifying the specific structure of the voltage control circuit in FIG. 4.

FIG. 6 exemplifies the structure of the voltage control circuit 3 (first functional circuit) that performs the operation as illustrated in FIGS. 4 and 5.

In a differential stage 8 which has a differential pair of nMOS transistors and a current mirror circuit comprising pMOS transistors as a load, a constant voltage Vmin0 is input to the gate of one of the nMOS transistors and the voltage Vo0 to the gate of the other nMOS transistor. The difference between both input terminal voltages, (Vo0−Vmin0), is amplified by the differential stage 8 and an output stage 9 which is comprised of a source follower fabricated by nMOS transistors and a current source. The amplified voltage is output from the output stage 9.

When Vo0≦Vmin0, the output terminal voltage Vo1 becomes a high level and an amplified voltage of (Vo0−Vmin0) is output. When Vo0≧Vmin0, a level fixing circuit 10 fixes the output terminal voltage Vo1 to a low level Vmin1. When the output terminal voltage Vo1 tends to become lower than Vmin1, the voltages at both ends (source and drain) of the nMOS transistor connected to the voltage source Vmin1 and the output terminal (Vo1) are inverted. Therefore, the nMOS transistor works as a switch. As a result, the voltage Vmin1 is supplied to the output terminal (Vo1), which is therefore set at the fixed voltage.

The voltage source (Vmin1) in the level fixing circuit 10 can be constituted by a voltage supply circuit 11 which uses the current mirror of nMOS transistors. The voltage value of a voltage source 12 in the voltage supply circuit 11 is so set that the output voltage of the output terminal 13 of the voltage supply circuit 11 becomes Vmin1. As the voltage source 12, an ordinary reference voltage generator, which generates a band-gap reference voltage, for example, may be used or a bias voltage may be externally applied. The circuit shown in FIG. 6 is suitably realized by the ordinary low-cost CMOS integrated circuit technology. While Vmin0 and Vmin1 respectively provide the fixed voltages of Vo0 and Vo1 and correspond to Vmin in FIGS. 4 and 5, they should not necessarily be the same voltage.

FIG. 7 shows the simulated results of the input/output characteristics of the voltage control circuit 3 (FIG. 6). When the output voltage Vo1 changes around the input voltage value and Vo0 goes higher, Vo1 is apparently fixed to Vmin1=−1.7 V. When the voltage control circuit 3 performs the feedback operation with the resistor 2 connected between the input and output terminals as shown in FIG. 3, Vo0 does not normally become lower than Vmin0. In accordance with the input/output characteristics in FIG. 7, therefore, as Vo0 becomes lower than Vmin0, Vo1 becomes saturated toward 1 V. This behavior does not raise any practical problem.

Figure 8A:
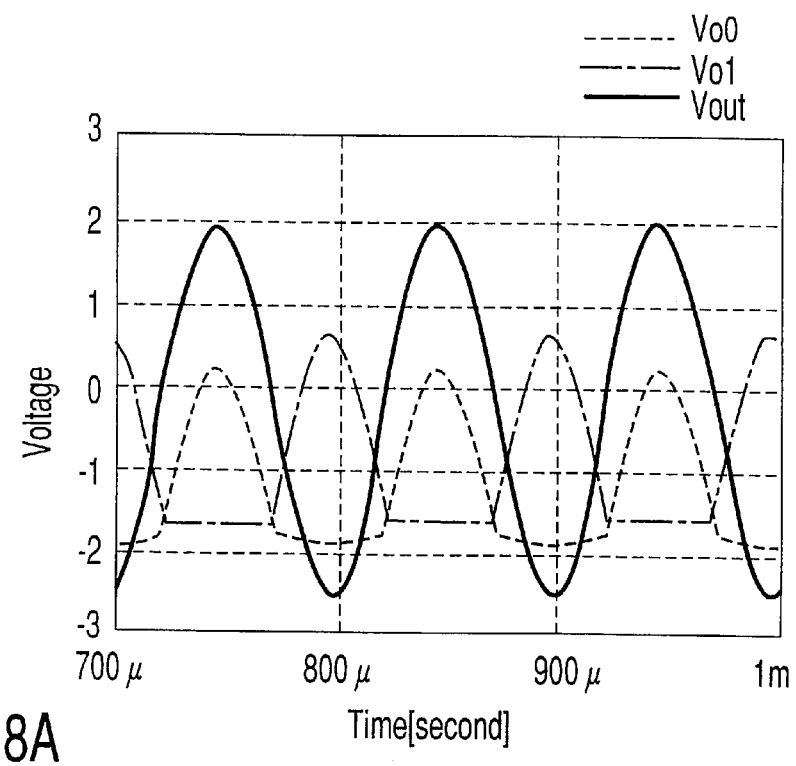
FIGS. 8A and 8B show diagrams showing the simulated results of individual voltage waveforms of an amplifier circuit which uses the voltage control circuit in FIG. 6.
Figure 8B:
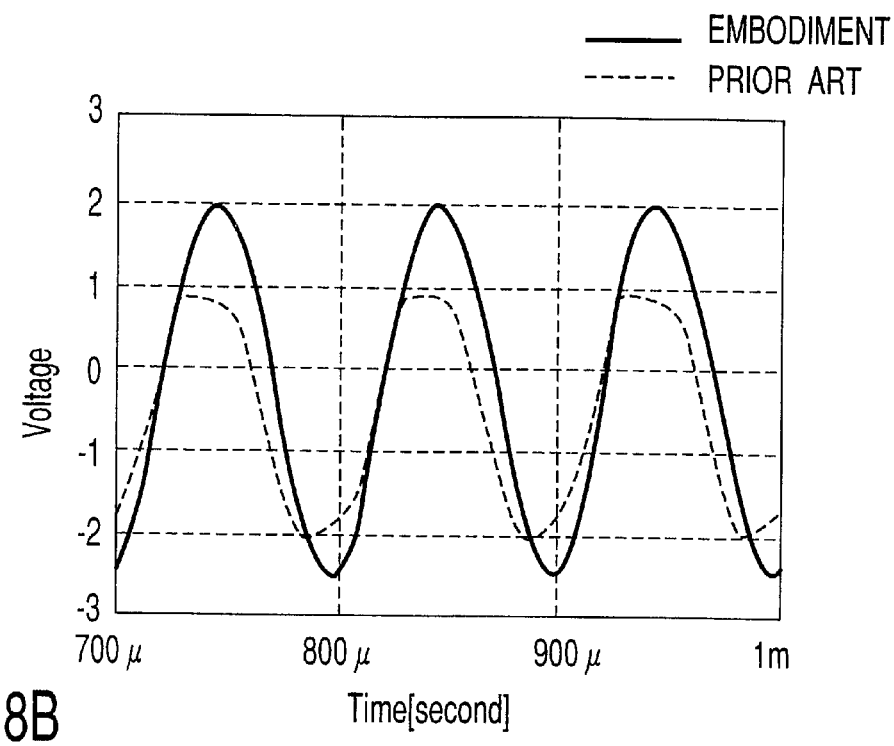

FIGS. 8A and 8B shows the simulated results of acquiring the operational voltages at the individual sections with respect to the amplifier circuit (FIG. 3) of this embodiment which uses the voltage control circuit 3 (FIG. 6).

As shown in FIG. 8A, the output voltage Vout has a large effective amplitude whereas the voltage Vo0 at the output terminal 101 and the voltage Vo1 at the output terminal 102 fall within a given voltage range. As shown in FIG. 8B, a wider dynamic range is apparently obtained as compared with the conventional amplifier circuit (FIG. 1A) which does not use the voltage control circuit 3. It is apparent from the simulated results that the output voltage of the conventional amplifier circuit is already saturated or distorted.

Figure 9:
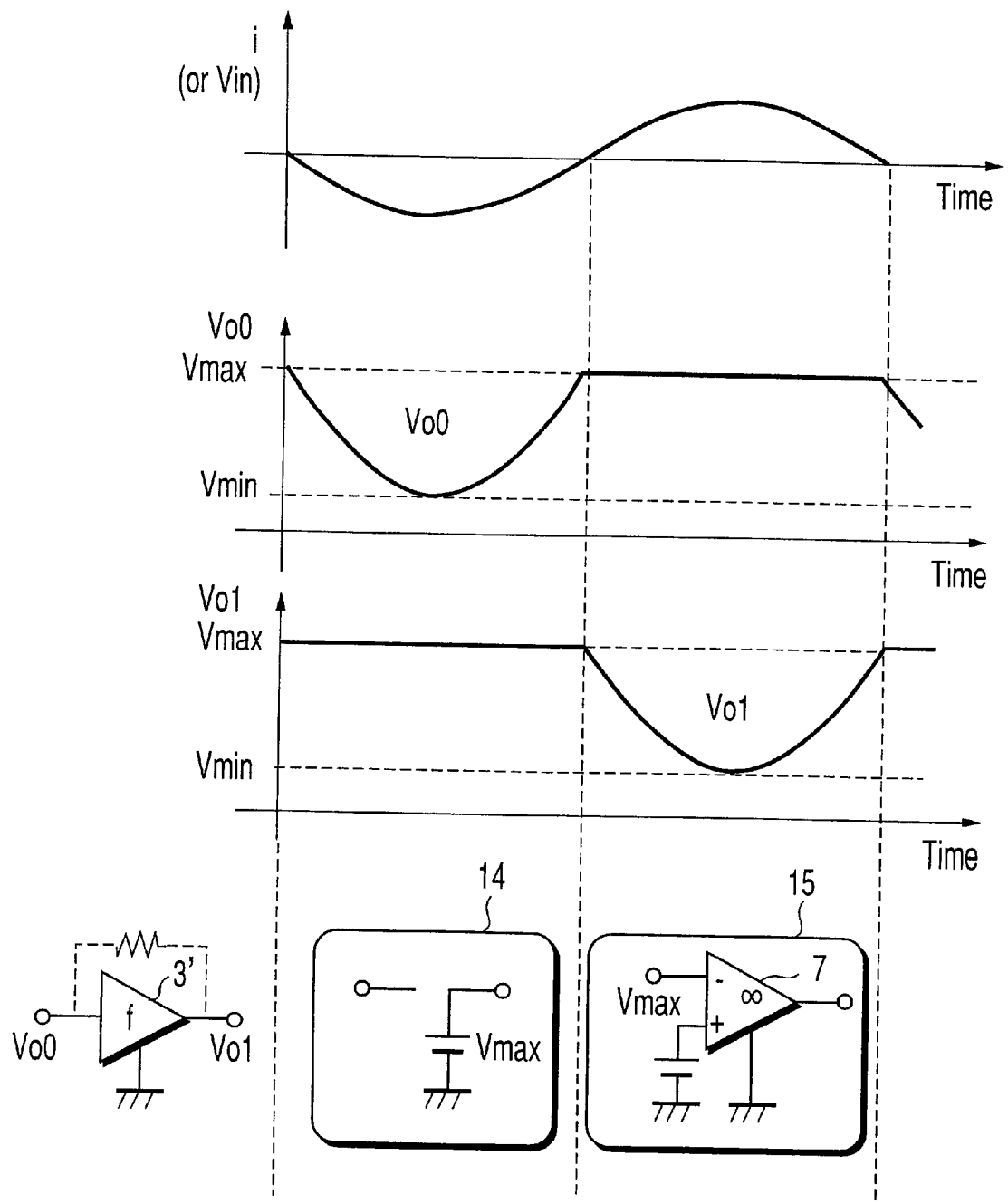
FIG. 9 is a diagram depicting the operation of a voltage control circuit used in the amplifier circuit in FIG. 3.

FIG. 9 illustrates an example of the operation of another voltage control circuit 3 (second functional circuit; hereinafter referred to as "voltage control circuit 3'" to be distinguished from the voltage control circuit 3 constituted by the first functional circuit) that is used in the amplifier circuit (FIG. 3) of this embodiment.

When the output current i of the OTA 1 in FIG. 3 is in a negative period, i.e., when the current flows toward the OTA 1 from the load resistor 2, the voltage control circuit 3' has the input terminal Vo0 open or has a sufficiently high input impedance and operates in such a way that the voltage at the output terminal Vo1 goes to a constant voltage Vmax. When the output current i of the OTA 1 in FIG. 3 is in a positive period or when the current flows from one end 101 of the load resistor 2 toward the other end 102, on the other hand, the input terminal Vo0 of the voltage control circuit 3' is virtually fixed to the constant voltage Vmax and the current i that flows in the load resistor 2 is supplied from the output terminal Vo1.

The voltage control circuit 3' is expressed by equivalent circuits 14 and 15 in FIG. 9. The equivalent circuit 15 is expressed by the OPA 7 which has an infinite input impedance and gain, with the load resistor 2 connected between its input and output terminals. In this case, the output resistance of the OPA 7 and noise of the output section do not affect the performance of the voltage control circuit 3'.

Figure 10:
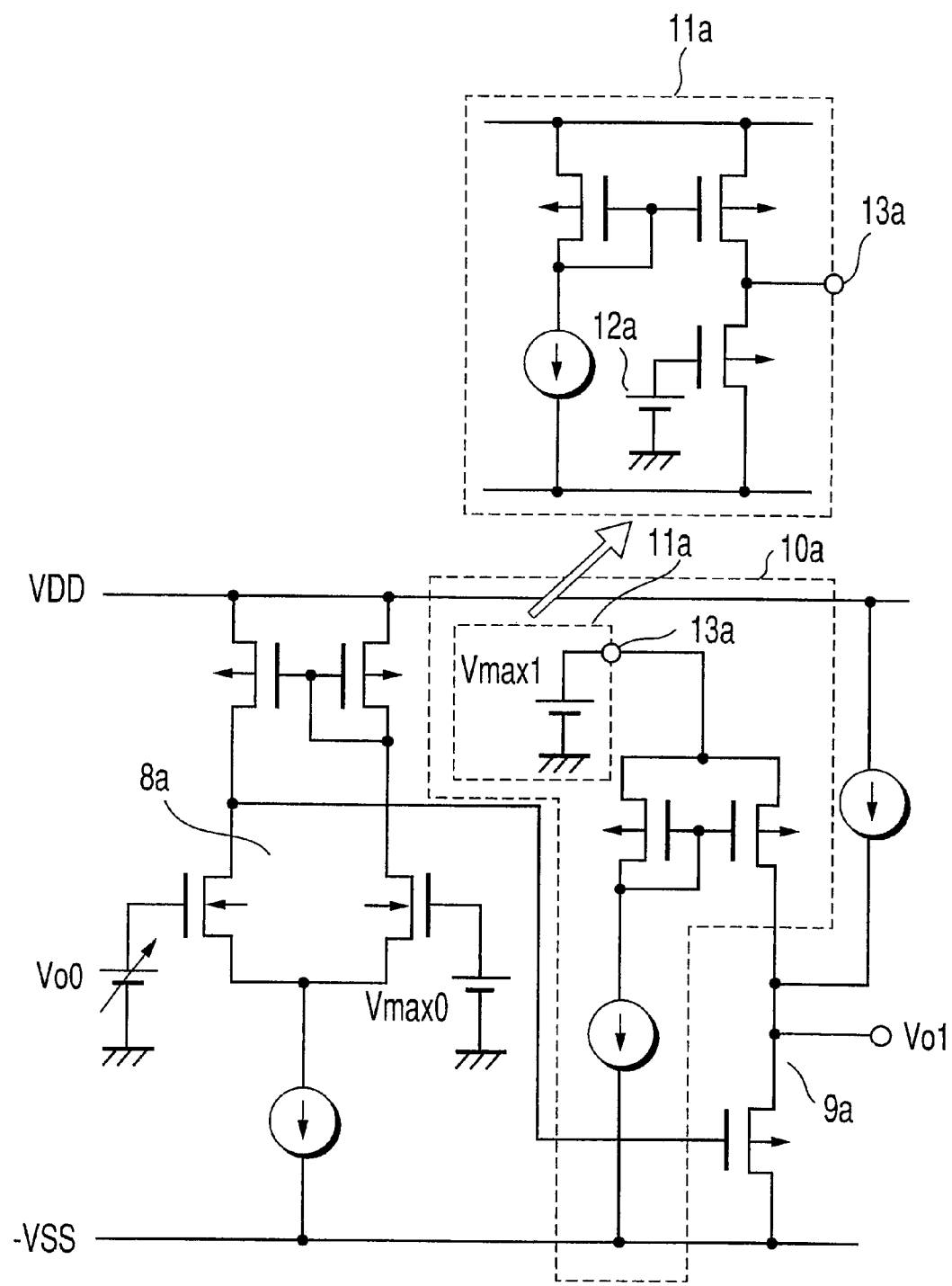
FIG. 10 is a diagram exemplifying the specific structure of the voltage control circuit in FIG. 9.

FIG. 10 exemplifies the circuit structure of the voltage control circuit 3' that performs the operation as illustrated in FIG. 9.

In a differential stage 8a which has a differential pair of nMOS transistors and a current mirror circuit comprising pMOS transistors as a load, a constant voltage Vmax0 is input to the gate of one of the nMOS transistors and the voltage Vo0 to the gate of the other nMOS transistor. The difference between both input terminal voltages, (Vo0−Vmax0), is amplified by an output stage 9a which is comprised of a source follower fabricated by pMOS transistors and a current source. The amplified voltage is output from the output stage 9a.

When Vo0≧Vmax0, (Vo0−Vmax0) is amplified and the voltage Vo1 is output from the output terminal. When Vo0≦Vmax0, the output voltage Vo1 goes to a high level, but a level fixing circuit 10a fixes the output terminal voltage Vo1 to a high level Vmax1. When the output terminal voltage Vo1 tends to become not less than Vmax1, the voltages at both ends (source and drain) of the pMOS transistor connected to the voltage source Vmax1 and the output terminal (Vo1) are inverted. Therefore, the PMOS transistor works as a switch. As a result, Vmax1 is supplied to the output terminal (Vo1), which is therefore set at the fixed voltage.

The voltage source Vmax1 in the level fixing circuit 10a can be constituted by a voltage supply circuit 11a which uses the current mirror of pMOS transistors. The voltage value of a voltage source 12a in the voltage supply circuit 11a is so set that the output voltage of the output terminal 13a of the voltage supply circuit 11a becomes Vmax1. As the voltage source 12a, an ordinary reference voltage generator, which generates a band-gap reference voltage, for example, may be used or a bias voltage may be externally applied. The circuit shown in FIG. 10 is suitably realized by the ordinary low-cost CMOS integrated circuit technology. While Vmax0 and Vmax1 respectively provide the fixed voltages of Vo0 and Vo1 and correspond to Vmax in FIG. 9, they should not necessarily be the same voltage.

Figure 11:
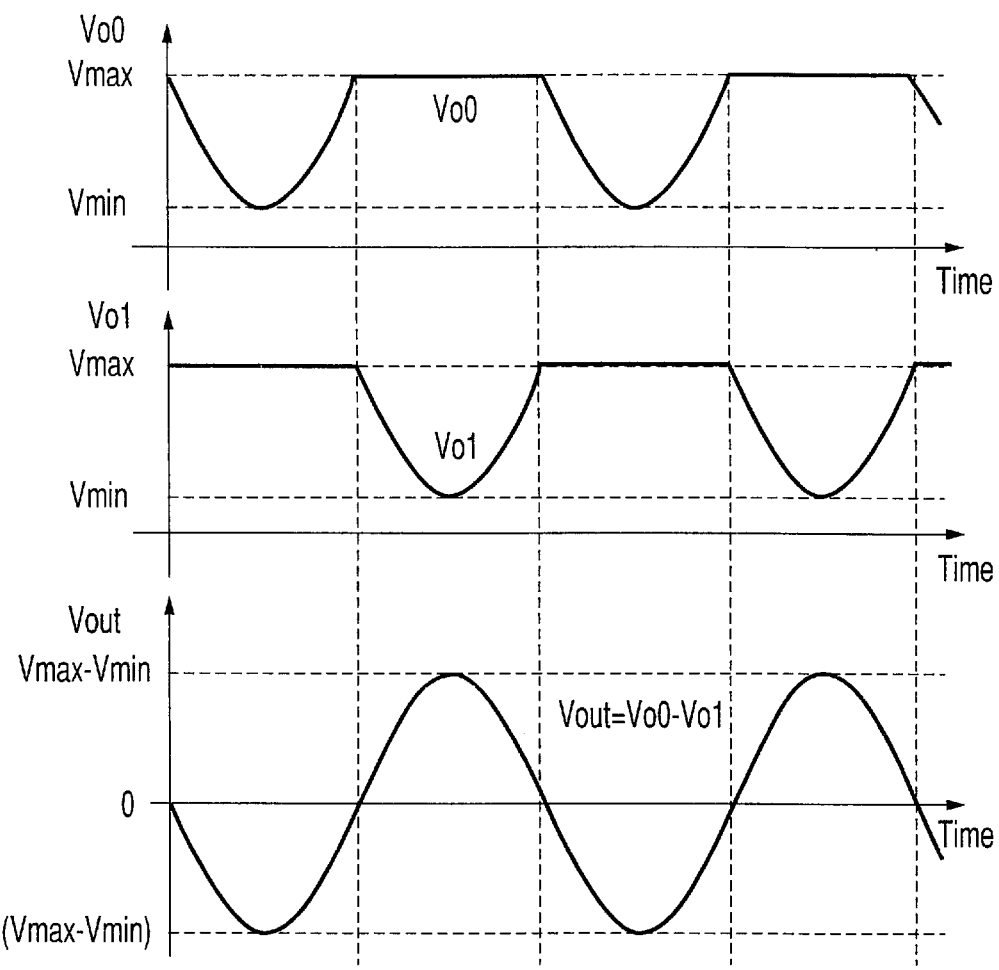
FIG. 11 is a diagram showing individual voltage waveforms of an amplifier circuit which uses the voltage control circuit in FIG. 10.

In the case of using the voltage control circuit 3', voltages as shown in FIG. 11 appear on the output voltages Vo0 and Vo1 in FIG. 3 in accordance with the input voltage Vin or the output current i. The voltage changes in Vo0 and Vo1 are equivalent to the voltage drop (gm·rL·Vin) caused by the load resistor 2 and the minimum value Vmin of Vo0 and the minimum value Vmin of Vo1 respectively correspond to the negative peak and positive peak of the input voltage Vin or the output current i.

The output voltage Vout is given by (Vo0−Vo1) and varies as shown in FIG. 11. The dynamic range of the output voltage Vout is increased twice as large as the dynamic range of the conventional amplifier circuit (FIG. 1A). It is assumed here that Vmax and Vmin represent the maximum and minimum voltages of the terminal voltage (output terminal voltage) in the amplifier circuit and the conventional amplifier circuit and the amplifier circuit of this embodiment operate on the same supply voltages.

Figure 12:
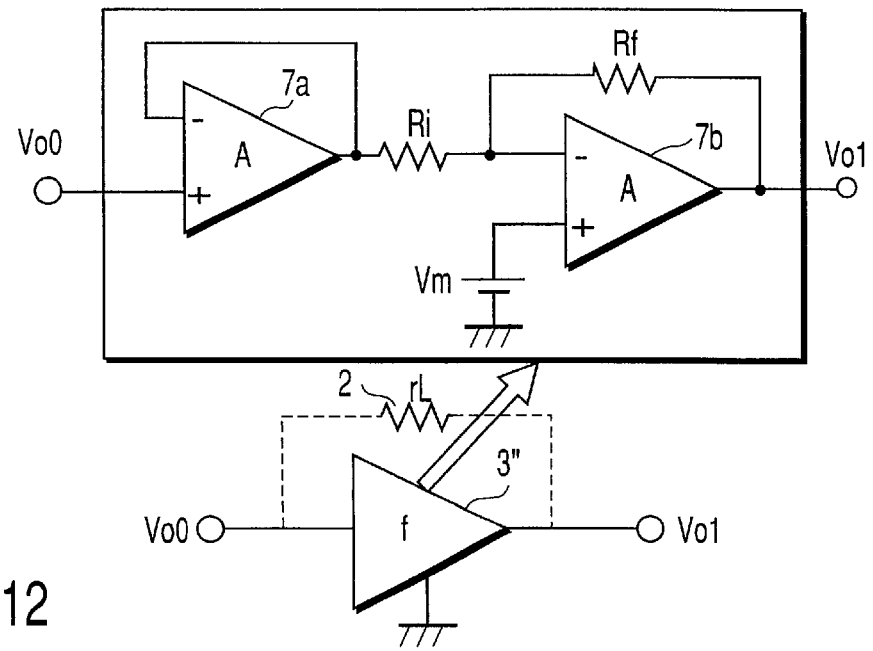
FIG. 12 is a diagram showing the structure of a voltage control circuit used in the amplifier circuit in FIG. 3.

FIG. 12 illustrates the structure of a further voltage control circuit 3 (third functional circuit; hereinafter referred to as "voltage control circuit 3'") to be distinguished from the voltage control circuits 3 and 3' respectively constituted by the first and second functional circuits) that is used in the amplifier circuit (FIG. 3) of this embodiment.

The voltage control circuit 3" is constructed by cascade-connecting a voltage follower comprising an OPA 7a to a resistor Ri and an inverting operational amplifier which comprises a feedback resistor Rf and an OPA 7b. As the voltage Vo0 is input to the input terminal of the voltage follower 7a, the amplified voltage Vo1 of Vo0 is acquired from the output terminal of the inverting operational amplifier 7b. The input voltage Vo0 of the voltage control circuit 3" is amplified in an inverted form by (−Rf/Ri) with the voltage Vm as a reference. If Vm is 0, the output voltage Vo1 becomes (−Rf/Ri)Vo0.

Figure 13:
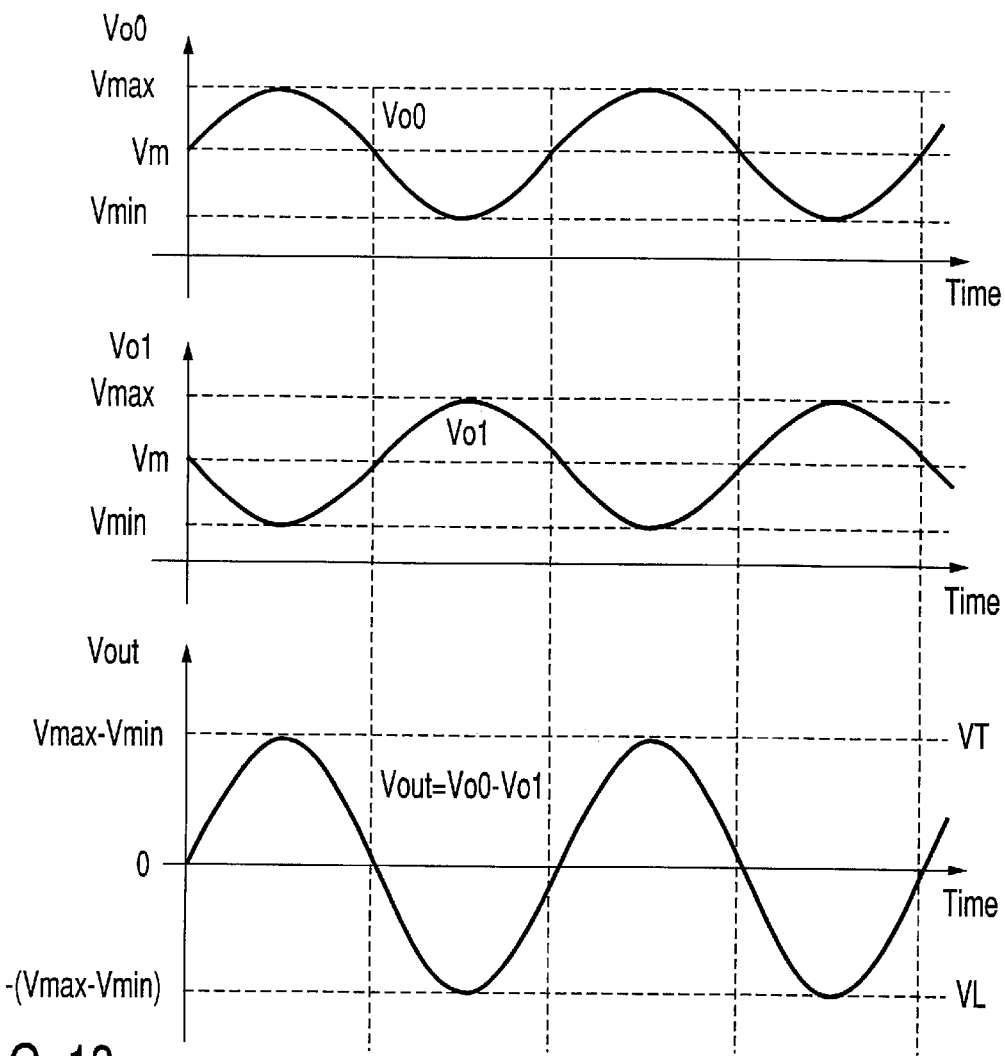
FIG. 13 is a diagram showing individual voltage waveforms of an amplifier circuit which uses the voltage control circuit in FIG. 12.

When the voltage control circuit 3" is used in the amplifier circuit in FIG. 3, the individual voltages shown in FIG. 13 are produced in accordance with the input voltage Vin or the output current i. The inverting amplifying action of the voltage control circuit 3" causes the inverted voltage waveform Vo1 of Vo0 to appear at the output terminal 102 or the other end of the load resistor 2 with respect to the voltage Vo0 at the output terminal 101 or one end of the load resistor 2. If Rf is equal to Ri, the voltage control circuit 3" becomes an inverting amplifier (inverter) with an amplification factor of (−1), and the voltage changes that appear on Vo0 and Vo1 are given by $$Vo0-Vm=+0.5 \cdot gm \cdot rL \cdot Vin \quad (6)$$

$$Vo1-Vm=-0.5 \cdot gm \cdot rL \cdot Vin \quad (7)$$

The maximum value Vmax and minimum value Vmin of Vo0 (or Vo1) correspond to the positive and negative peaks of the input voltage Vin and (Vmax−Vmin) is equal to the maximum value of the voltage drop (gm·rL·Vin) across the load resistor 2. The output voltage Vout is given by (Vo0−Vo1) and varies between VT (=Vmax−Vmin) and VL (=−Vmax+Vmin) as shown in FIG. 13. The dynamic range therefore becomes 2(Vmax−Vmin), doubled the dynamic range of the conventional amplifier circuit (FIG. 1).

An MOS inverter with a high input impedance may be used in place of the voltage control circuit 3" in FIG. 12 as well as the voltage control circuit 3 in the amplifier circuit in FIG. 3. In this case, the threshold voltage of the MOS inverter is set to Vm and the MOS inverter is allowed to operate in a range of a constant amplification factor. The operation is the same as indicated by the voltage waveforms in FIG. 13.

Second Embodiment

Figure 14:
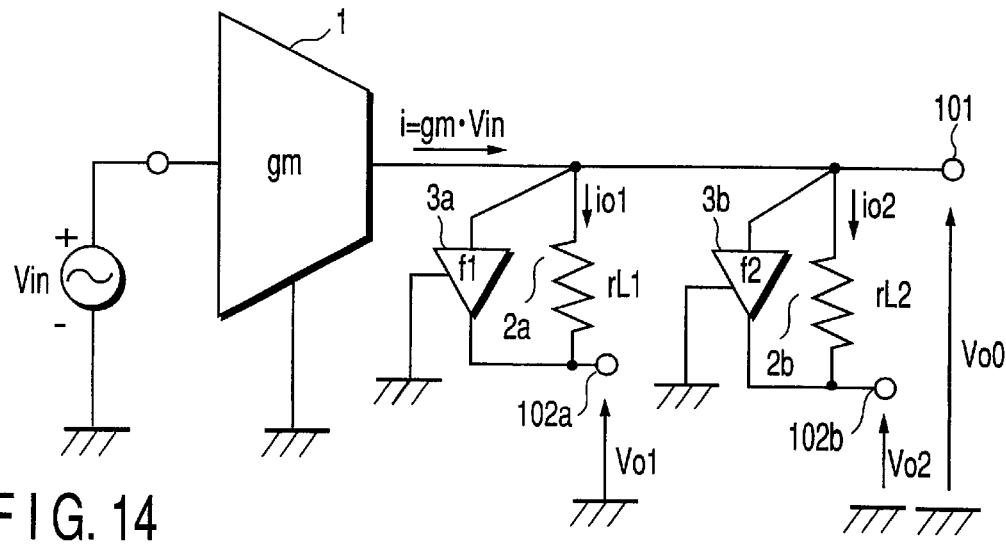
FIG. 14 is a diagram illustrating the structure of an amplifier circuit in a semiconductor integrated circuit according to a second embodiment.

FIG. 14 is a diagram illustrating the structure of an amplifier circuit in a semiconductor integrated circuit according to the second embodiment of the invention.

This amplifier circuit has two sets of load resistors 2a and 2b on the output side of the OTA 1 and voltage control circuits 3a and 3b, both identical to the load resistor 2 and voltage control circuit 3 in the amplifier circuit (FIG. 3) of the first embodiment. One end of the parallel circuit of the first load resistor 2a and the first voltage control circuit 3a and one end of the parallel circuit of the second load resistor 2b and the second voltage control circuit 3b are commonly connected to the output terminal 101. The other ends of the parallel circuits are respectively connected to output terminals 102a and 102b.

Given that the resistance rL1 of the load resistor 2a is equal to the resistance rL2 of the load resistor 2b in the above structure and is denoted by rL, then $$Vo0-Vo1=rL \cdot io1 \quad (8)$$

$$Vo0-Vo2=rL \cdot io2 \quad (9)$$

Thus, $$\begin{aligned} Vout &= gm \cdot rL \cdot Vin = rL(io1 + io2) \\ &= (Vo0 - Vo1) + (Vo0 - Vo2) \\ &= 2Vo0 - Vo1 - Vo2 \end{aligned} \quad (10)$$

is satisfied. That is, the output voltage Vout of the amplifier circuit is expressed by the voltages Vo0, Vo1 and Vo2 of the output terminals 101, 102a and 102b. Assuming that the voltages Vo0, Vo1 and Vo2 take values in the voltage range from the maximum value Vmax to the minimum value Vmin, the following equation is satisfied in the voltage range of Vout (=2Vc0−Vo1−Vo2).

$$2Vmin - 2Vmax \leq 2Vo0 - Vo1 - Vo2 \quad (11)$$
$$\leq 2Vmax - 2Vmin$$

Therefore, the dynamic range of the output voltage Vout in this embodiment becomes 4(Vmax−Vmin) which is four times the dynamic range of the conventional amplifier circuit (FIG. 1A). Even if the operational range is reduced to ¼ due to the reduction in supply voltages, it is possible to guarantee the same dynamic range.

Figure 15:
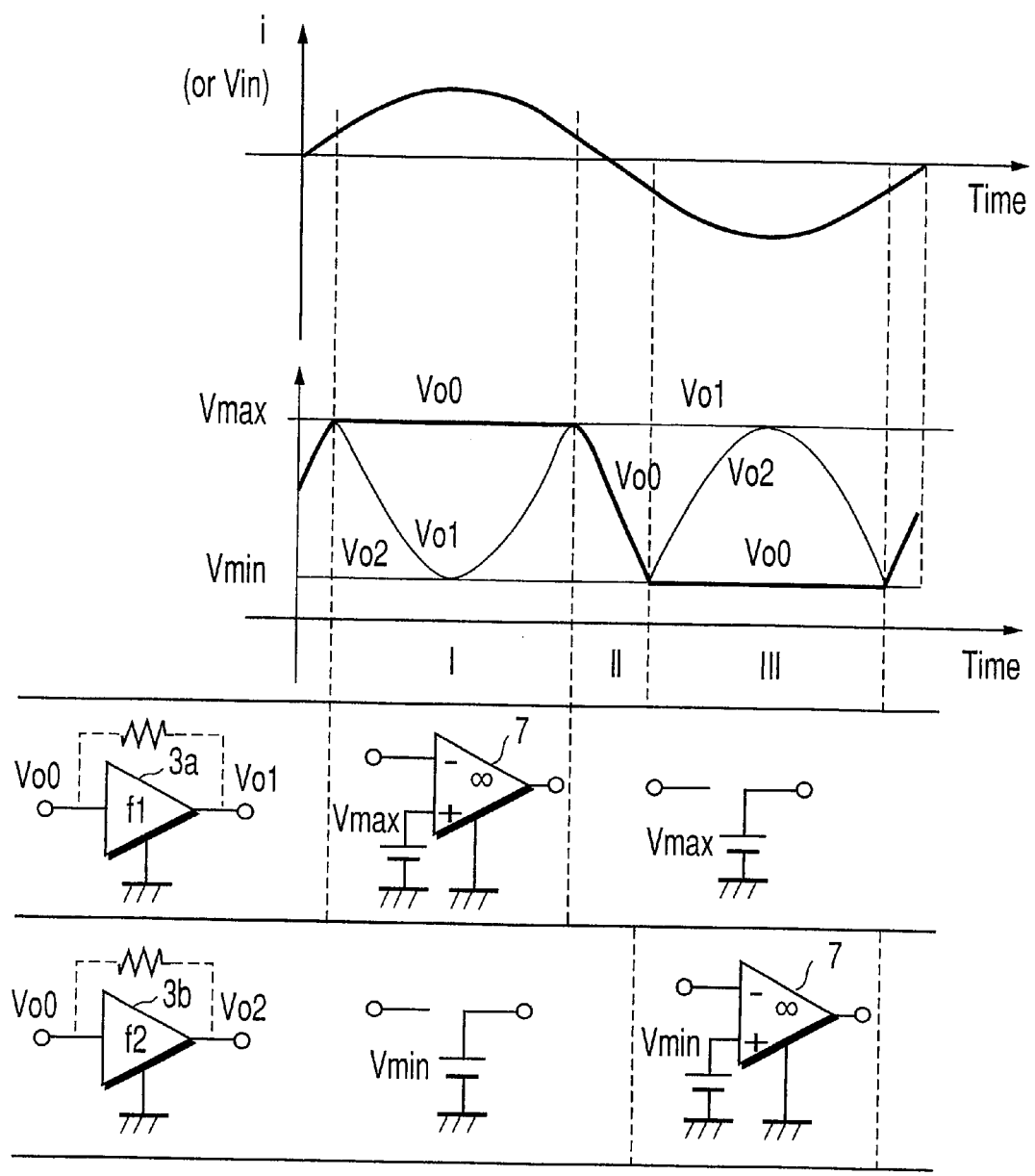
FIG. 15 is a diagram depicting the operation of a voltage control circuit used in the amplifier circuit in FIG. 14.

FIG. 15 shows the operation of two voltage control circuits 3a and 3b used in the amplifier circuit (FIG. 14) according to this embodiment.

As the input terminal voltage Vo0 tends to become higher than the constant voltage Vmax, the first voltage control circuit 3a works as the OPA 7 which has an infinite input impedance and gain. When the input terminal voltage Vo0 becomes lower than the constant voltage Vmax, the input is opened and the output is fixed to the constant voltage Vmax. That is, the first voltage control circuit 3a has the same function as the voltage control circuit 3' that is used in the first embodiment. As the input terminal voltage Vo0 tends to become higher than the constant voltage Vmin, the input of the second voltage control circuit 3b is opened and the output is fixed to the constant voltage Vmin. When the input voltage terminal Vo0 becomes lower than the constant voltage Vmin, the second voltage control circuit 3b works as the OPA 7 with an infinite input impedance and gain. That is, the second voltage control circuit 3b has the same function as the voltage control circuit 3 that is used in the first embodiment.

In other words, when the output current i of the OTA 1 (=gm·Vin) flows in accordance with the input voltage Vin of the amplifier circuit (FIG. 14) and the voltage Vo0 at the output terminal 101 tends to change, the two voltage control circuits 3a and 3b operate so that Vo0, Vo1 and Vo2 vary as shown in FIG. 15.

In FIG. 15, in a period I where Vo0 tends to become higher than Vmax, Vo0 is virtually fixed to Vmax by the feedback operation of the OPA 7 of the first voltage control circuit 3a. As an output current io1 from the OTA 1 flows across the first load resistor 2a, a voltage variation of Vo1 appears at the output terminal 102a of the first voltage control circuit 3a. The voltage Vo2 of the output terminal 102b of the second voltage control circuit 3b is fixed to Vmin so that a constant current io2 flows across the second load resistor 2b. As the current io2 is given by $$io2=(Vmax-Vmin)/rL2 \qquad (12),$$

io1 becomes $$io1 = i - io2 \qquad (13)$$
$$= gm \cdot Vin - (Vmax - Vmin)/rL2$$

Further, io1 is given as follows by using Vo1:

$$io1=(Vmax-Vo1)/rL1 \qquad (14)$$

From the equations 13 and 14, Vo1 varies according to the following equation.

$$Vo1 = gm \cdot rL1 \cdot Vin - \qquad (15)$$
$$(Vmax - Vmin)rL1/rL2 + Vmax$$

Assuming now that Vo1 has reached Vmin as shown in FIG. 15 when the voltage Vin or the current i reached a peak value, then an equation 16 below $$Vin = (Vmax - Vmin)/gm(rL1/rL2) \qquad (16)$$
$$= 2(Vmax - Vmin)/(gm \cdot rL)$$

is satisfied and provides the maximum value of Vin, provided that rL=rL1=rL2.

In a period II where Vo0 drops to Vmin from Vmax, the voltage at the output terminal 102a of the first voltage control circuit 3a is fixed to Vmax and the voltage at the output terminal 102b of the second voltage control circuit 3b is fixed to Vmin. The currents io1 and io2 that are given by the following equations respectively flow across the load resistors 2a and 2b while satisfying i=io1+io2.

$$io1=(Vo1-Vmax)/rL1 \qquad (17)$$
$$io2=(Vo1-Vmin)/rL2 \qquad (18)$$

In a period III where Vo0 tends to become lower than Vmin, the voltage Vo0 at the input terminal 102b of the second voltage control circuit 3b is virtually fixed to Vmin by the feedback operation of the OPA 7. As the output current io2 flows across the second load resistor 2b, a voltage variation of Vo2 appears at the output terminal 102b of the second voltage control circuit 3b. The voltage Vo1 of the output terminal 102a of the first voltage control circuit 3a is fixed to Vmax so that the constant current io1 flows across the first load resistor 2a. As the current io1 is given by $$io1=(Vmin-Vmax)/rL1 \qquad (19),$$

io2 becomes $$io2 = i - io1 \qquad (20)$$
$$= gm \cdot Vin + (Vmax - Vmin)/rL1$$

Further, io2 is given as follows by using Vo2:

$$io2=(Vmin-Vo2)/rL2 \qquad (21)$$

From the equations 20 and 21, Vo2 varies according to the following equation.

$$Vo2 = gm \cdot rL2 \cdot Vin - \qquad (22)$$
$$(Vmax - Vmin)rL2/rL1 + Vmin$$

Assuming now that Vo2 has reached Vmax as shown in FIG. 15 when the voltage Vin or the current i reached a peak value, then the following equation 23

$$Vin = (Vmax - Vmin)/gm(rL1 + rL2) \qquad (23)$$
$$= -2(Vmax - Vmin)/(gm \cdot rL)$$

is satisfied and provides the minimum value of Vin, provided that rL=rL1=rL2.

It is apparent from the equations 16 and 23 that the dynamic range of the output voltage Vout (=gm·rL·Vin) of the amplifier circuit (FIG. 14) becomes 4(Vmax−Vmin) which is four times the dynamic range of the conventional amplifier circuit (FIG. 1A).

The first voltage control circuit 3a and second voltage control circuit 3b used in the amplifier circuit (FIG. 14) of this embodiment can take the structures of the voltage control circuit 3' (FIG. 10) and the voltage control circuit 3 (FIG. 6) used in the amplifier circuit (FIG. 3) of the first embodiment. The operations of the voltage control circuits 3a and 3b are the same as those of the voltage control circuits 3' and 3.

Figure 16:
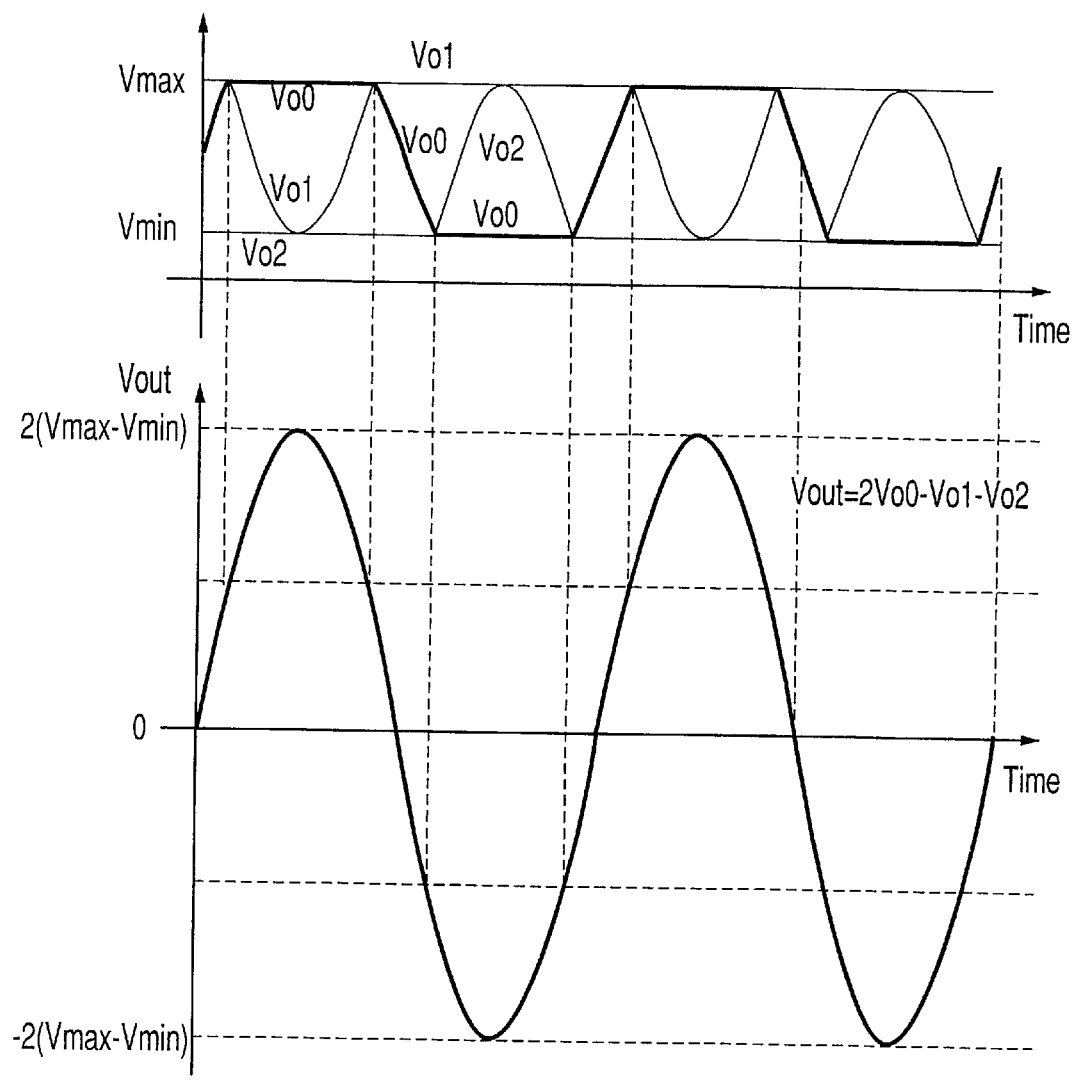
FIG. 16 is a diagram showing individual voltage waveforms of an amplifier circuit which uses the voltage control circuit in FIG. 14.

FIG. 16 shows the individual voltage waveforms of the amplifier circuit (FIG. 14) of this embodiment which uses the two voltage control circuits 3a and 3b. Although the output terminal voltages Vo0, Vo1 and Vo2 are limited to the voltage range between Vmin and Vmax, the effective variation range of the output voltage Vout is 4(Vmax−Vmin). Apparently, the dynamic range becomes four times the dynamic range of the conventional amplifier circuit (FIG. 1A).

Third Embodiment

Figure 17:
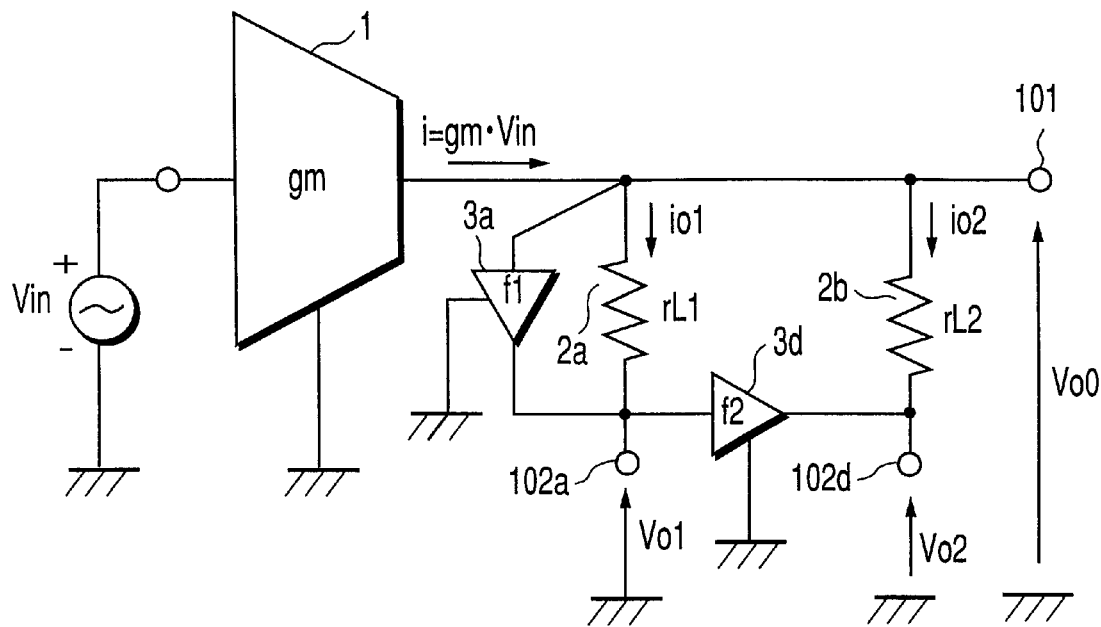
FIG. 17 is a diagram illustrating the structure of an amplifier circuit in a semiconductor integrated circuit according to a third embodiment.

FIG. 17 is a diagram illustrating the structure of an amplifier circuit in a semiconductor integrated circuit according to the third embodiment of the invention.

One ends of the load resistors 2a and 2b are connected to the output terminal 101 of the OTA 1. The voltage control circuit (first voltage control circuit) 3a has an input terminal connected to the output terminal 101 and an output terminal connected to the other end 102a of the load resistor 2a. The input terminal and output terminal of a voltage control circuit (third voltage control circuit) 3d are respectively connected to the other ends 102a and 102d of the load resistors 2a and 2b.

Given that the resistance rL1 of the load resistor 2a is equal to the resistance rL2 of the load resistor 2b and is denoted by rL, then the equations 8 and 9 are satisfied as in the case of the amplifier circuit of the second embodiment shown in FIG. 14 and the output voltage Vout is given by the equation 10. That is, the output voltage Vout of the amplifier circuit is expressed by the voltages Vo0, Vo1 and Vo2 of the output terminals 101, 102a and 102d. Assuming that the voltages Vo0, Vo1 and Vo2 take values in the voltage range from the maximum value Vmax to the minimum value Vmin, the equation 11 is satisfied over the voltage range of Vout (=2Vo0−Vo1−Vo2). Therefore, the dynamic range of the output voltage Vout in this embodiment becomes 4(Vmax−Vmin), four times the dynamic range of the conventional amplifier circuit (FIG. 1A). Even if the operational range is reduced to ¼ due to the reduction in supply voltages, it is possible to guarantee the same dynamic range.

Figure 18:
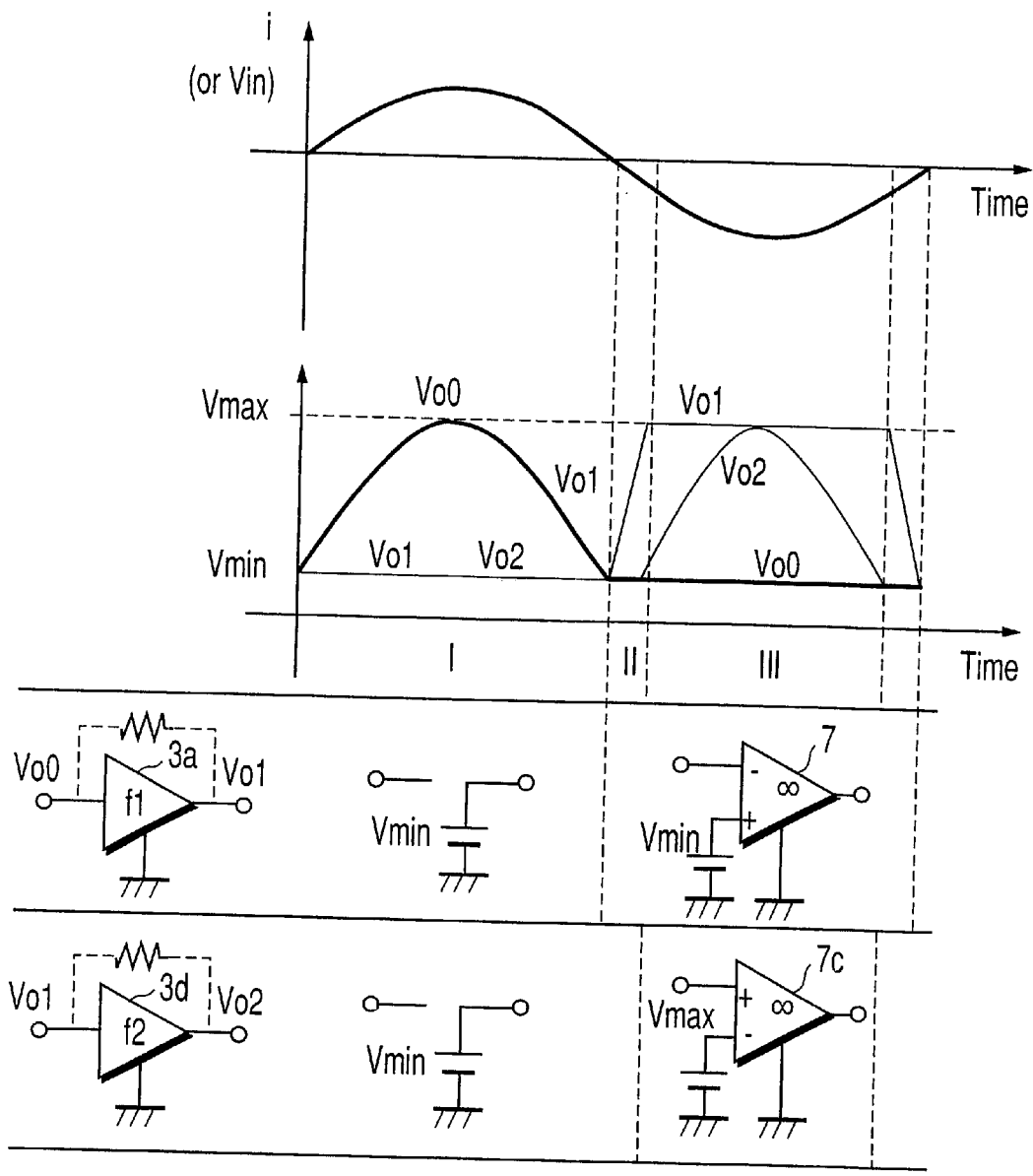
FIG. 18 is a diagram depicting the operation of a voltage control circuit used in the amplifier circuit in FIG. 17.

FIG. 18 shows the operation of the voltage control circuits 3a and 3d used in the amplifier circuit (FIG. 17) according to this embodiment.

As the input terminal voltage (Vo0) becomes higher than the constant voltage Vmin, the input of the voltage control circuit 3a is opened and the output is fixed to the constant voltage Vmin. When the input terminal voltage (Vo0) tends to go lower than the constant voltage Vmin, the voltage control circuit 3a works as the OPA 7 which has an infinite input impedance and gain. That is, the voltage control circuit 3a has the same function as the voltage control circuit 3 used in the first embodiment. As the input terminal voltage (Vo1) tends to become higher than the constant voltage Vmax, the voltage control circuit 3d works as an OPA 7c with an infinite input impedance and gain. When the input voltage terminal (Vo1) is lower than the constant voltage Vmax, the input of the voltage control circuit 3b is opened and the output is fixed to the constant voltage Vmin.

The voltage Vo1 is input to the non-inverting input terminal of the OPA 7c and the constant voltage Vmax to the inverting input terminal thereof. The OTA 1 outputs the output current i (=gm·Vin) in accordance with the input voltage Vin of the amplifier circuit (FIG. 17). When the voltage Vo0 at the output terminal 101 tends to vary, the voltage control circuits 3a and 3d function to change Vo0, Vo1 and Vo2 vary as shown in FIG. 18.

In the period I, Vo0 is higher than Vmin, the voltage Vo1 at the output terminal 102a of the voltage control circuit 3a is fixed to Vmin and the voltage Vo2 at the output terminal 102d of the voltage control circuit 3d is fixed to Vmin. The currents io1 and io2 that are given by the following equations 24 and 25 respectively flow across the load resistors 2a and 2b while satisfying i=io1+io2.

$$io1 = (Vo0 - Vmin)/rL1 \quad (24)$$

$$io2 = (Vo0 - Vmin)/rL2 \quad (25)$$

Suppose that Vo0 has reached Vmax as shown in FIG. 18 when the voltage Vin or the current i reached a positive peak value. Then, the maximum value of the output voltage Vout is acquired as follows.

$$i = gm \cdot Vin = io1 + io2 \quad (26)$$
$$= (Vmax - Vmin)(1/rL1 + 1/rL2)$$
$$= 2(Vmax - Vmin)/rL$$

$$Vout = gm \cdot rL \cdot Vin \quad (27)$$
$$= 2(Vmax - Vmin)$$

on the assumption that rL=rL1=rL2.

In the period II where Vo0 tends to go lower than Vmin, the voltage Vo0 is virtually fixed to Vmin by the feedback operation of the OPA 7. As the output current io1 flows across the load resistor 2a, a voltage variation of Vo1 appears at the output terminal 102a of the voltage control circuit 3a.

As the input voltage Vo1 of the voltage control circuit 3d does not exceed Vmax, the voltage Vo2 at the output terminal 102d stays fixed to Vmin. Because the voltages at both ends of the load resistor 2b or the voltages at the output terminal 101 and output terminal 102d are both fixed to Vmin, the current io2 of the load resistor 2b is 0. Thus, the current io1 is equal to the output current i of the OTA 1 and the voltage Vo1 varies according to the following equation.

$$Vo1 = Vmin - gm \cdot rL \cdot Vin \quad (28)$$

It is assumed that the voltage Vo1 becomes Vmin when the voltage Vin is 0. As the voltage Vin (or the current I) becomes negative and lower, the voltage Vo1 rises to Vmax.

When the voltage Vo1 tends to go higher than Vmax in the period III, the variable voltage Vo2 appears at the output terminal 102d due to the amplification operation of the OPA 7c in the voltage control circuit 3d. At this time, the input voltage Vo1 of the voltage control circuit 3d is fixed to Vmax by the feedback operation of the circuit system. As the voltage Vo0 at the output terminal 101 is virtually fixed to Vmin by the feedback operation of the OPA 7 in the voltage control circuit 3a, the current io1 becomes a constant current (Vmin−Vmax)/rL1. Therefore, the variable current io2 (=i−io1) according to the voltage Vin or the current i flows across the load resistor 2b. The current io2 is supplied from the output terminal of the OPA 7c of the voltage control circuit 3d. The current io2 and the voltage Vo2 are expressed by the following equations 29 and 30.

$$io2 = i - io1 \quad (29)$$
$$= gm \cdot Vin - (Vmin - Vmax)/rL1$$

$$Vo2 = Vmin - rL2 \cdot io2 \quad (30)$$
$$= Vmin - rL2(gm \cdot Vin - (Vmin - Vmax)/rL1)$$

Assuming now that Vo2 has reached Vmax as shown in FIG. 18 when the voltage Vin or the current i reached a negative peak value, then the following equations 31 and 32

$$Vin = -(Vmax - Vmin)(rL1 + rL2)/gm(rL1 \cdot rL2) \quad (31)$$
$$= -2(Vmax - Vmin)/(gm \cdot rL)$$

$$Vout = gm \cdot rL \cdot Vin \quad (32)$$
$$= -2(Vmax - Vmin)$$

are met. Given that rL1=rL2=rL, the equation 32 provides the minimum value of the output voltage Vout.

It is apparent from the equations 27 and 32 that the dynamic range of the output voltage Vout (=gm·rL·Vin) of the amplifier circuit (FIG. 17) becomes 4 (Vmax−Vmin) which is four times the dynamic range of the conventional amplifier circuit (FIG. 1).

The voltage control circuit 3a used in the amplifier circuit (FIG. 17) of this embodiment can take the structure of the voltage control circuit 3 (FIG. 6) used in the amplifier circuit (FIG. 3) of the first embodiment. The operation of the voltage control circuit 3a is the same as that of the voltage control circuit 3.

Figure 19:
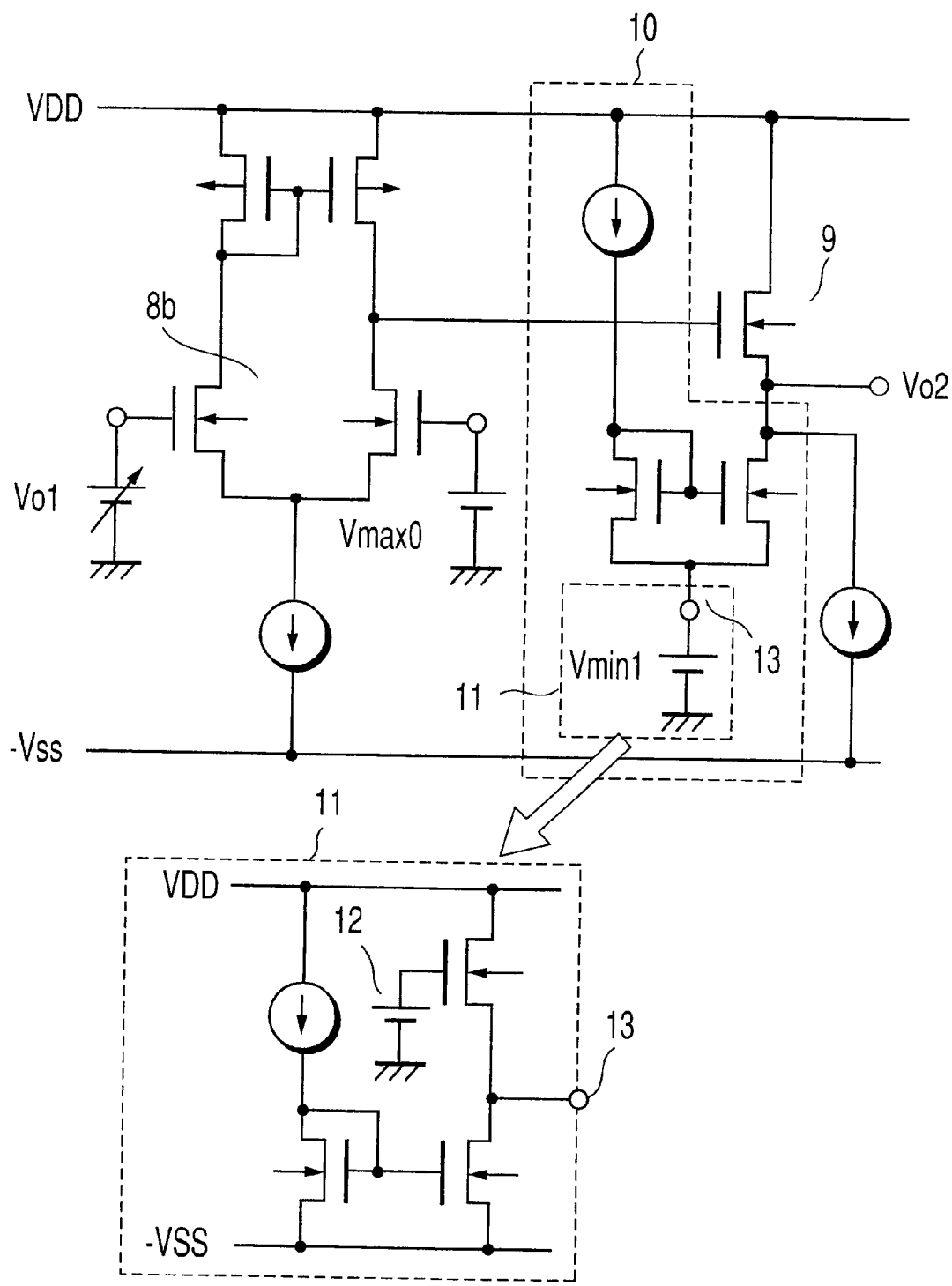
FIG. 19 is a diagram exemplifying the specific structure of a voltage control circuit which is used in the amplifier circuit in FIG. 17.

FIG. 19 exemplifies the structure of the voltage control circuit 3d (fourth functional circuit) that is used in the amplifier circuit (FIG. 17) of this embodiment. In a differential stage 8b which has a differential pair of nMOS transistors and a current mirror circuit comprising pMOS transistors as a load, the voltage Vo1 is input to the gate of one of the nMOS transistors and a constant voltage Vmax0 is input to the gate of the other nMOS transistor. The difference between both input terminal voltages, (Vo1−Vmax0), is amplified by the differential stage 8b and the output stage 9 which includes a source follower fabricated by nMOS transistors and a current source. The amplified voltage is output from the output stage 9.

When Vo1≦Vmax0, the output terminal voltage Vo2 goes to a low level and is fixed to a low level Vmin1 by the level fixing circuit 10. When the output terminal voltage Vo2 is lower than Vmin1, the nMOS transistor that is connected to the voltage source Vmin1 and the output terminal (Vo2) works as a switch. As a result, Vmin1 is supplied to the output terminal (Vo2), which is therefore set at the fixed voltage. The voltage source Vmin1 can be constituted by the voltage supply circuit 11 that uses the current mirror of nMOS transistors. The voltage value of the voltage source 12 in the voltage supply circuit 11 is so set that the output voltage of the output terminal 13 of the voltage supply circuit 11 becomes Vmin1. As the voltage source 12, an ordinary reference voltage generator, which generates a band-gap reference voltage, for example, may be used or a bias voltage may be externally applied.

When Vo1≧Vmax0, on the other hand, the non-inverted, amplified voltage Vo2 of the difference between both input terminal voltages (Vo1−Vmax0) is output. Vmax0 and Vmin1 respectively provide the fixed voltages of Vo1 and Vo2 and correspond to Vmax and Vmin in FIG. 18. The circuit shown in FIG. 19 can easily be realized by the ordinary low-cost CMOS integrated circuit technology.

Figure 20:
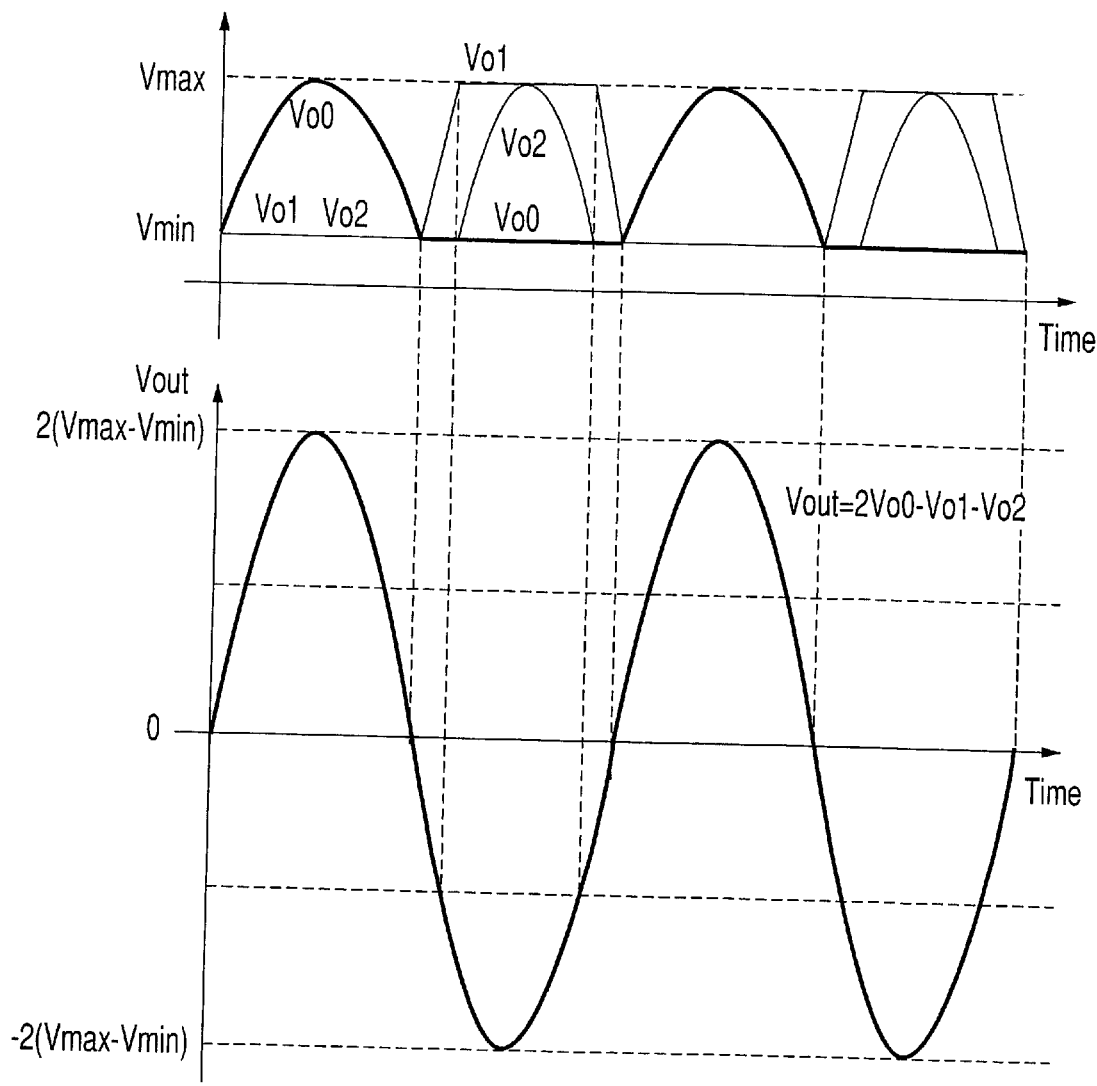
FIG. 20 is a diagram showing individual voltage waveforms of an amplifier circuit which uses the voltage control circuit in FIG. 19.

FIG. 20 shows the individual voltage waveforms of the amplifier circuit (FIG. 17) of this embodiment which uses the voltage control circuits 3a and 3d. The variation ranges of the output terminal voltages Vo0, Vo1 and Vo2 are all restricted to the voltage range between Vmax and Vmin. Although the maximum amplitude of variation is (Vmax−Vmin), the effective variation range of the output voltage Vout is 4(Vmax−Vmin). It is apparent that the dynamic range is four times the dynamic range of the conventional amplifier circuit (FIG. 1). Even if the operational range becomes narrower due to the reduction in supply voltages, the same dynamic range can be guaranteed.

FIGS. 21A and 21B show the simulated results of acquiring the individual voltages Vo0, Vo1, Vo2 and Vout (=2Vo0−Vo1−Vo2) of the amplifier circuit (FIG. 17) of this embodiment.

FIG. 21A illustrates the DC characteristics that show the DC voltage values of the voltages Vo0, Vo1, Vo2 and Vout (=2Vo0−Vo1−Vo2) acquired with respect to the output current i of the OTA 1 according to the input voltage Vin of the amplifier circuit. The output voltage Vout of the amplifier circuit linearly varies with a greater variation amplitude than those of the other voltages Vo0, Vo1 and Vo2. Apparently, this embodiment provides a broader dynamic range.

FIG. 21B illustrates the time response obtained, which apparently shows that the combination of the voltages Vo0, Vo1 and Vo2 has resulted in a sinusoidal voltage Vout (=2Vo0−Vo1−Vo2) with the wide dynamic range. The sinusoidal voltage Vout had an excellent THD value of 0.0008%.

Figure 22:
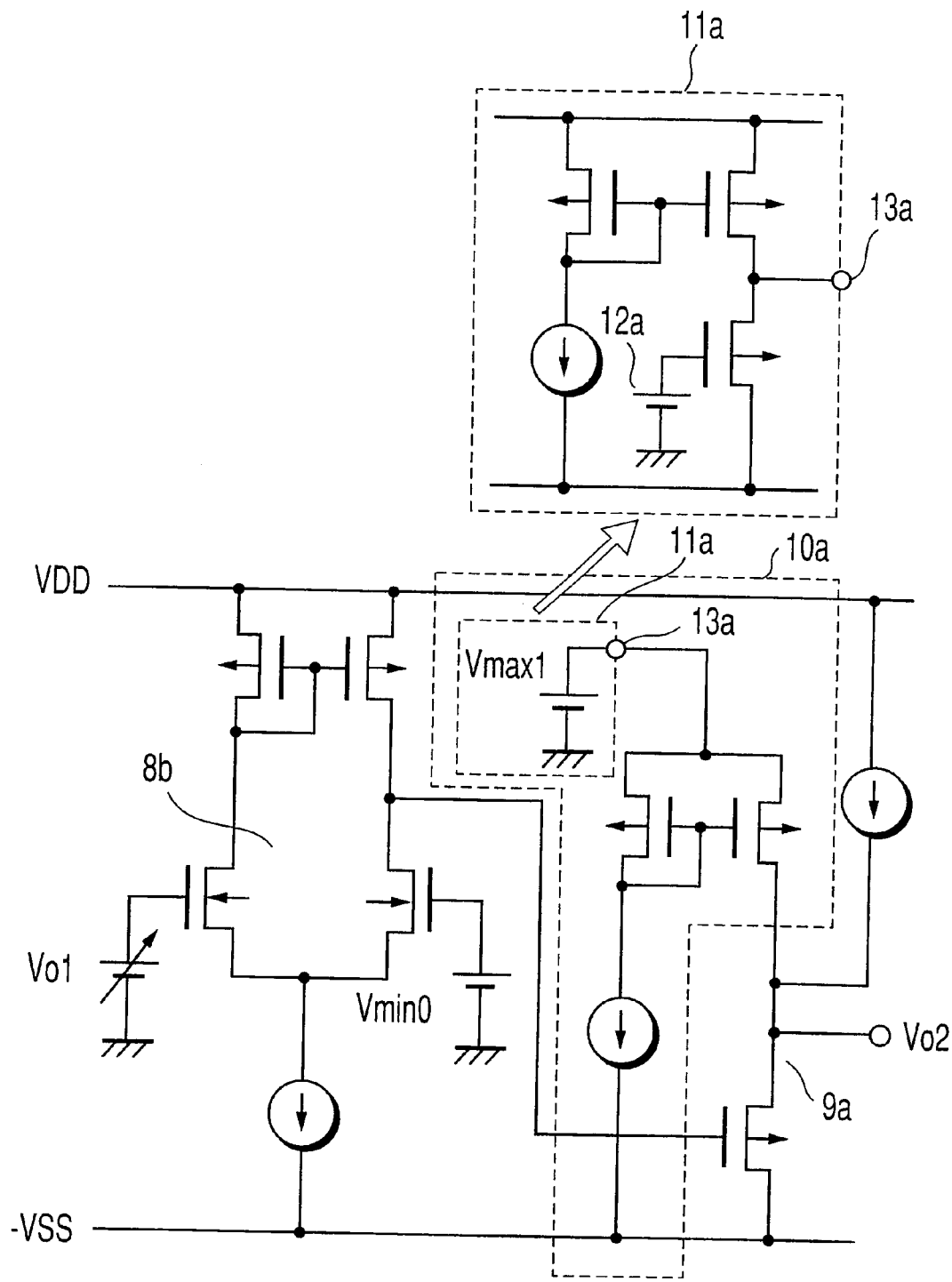
FIG. 22 is a diagram exemplifying the specific structure of the voltage control circuit used in the amplifier circuit in FIG. 17.

The voltage control circuit 3a used in the amplifier circuit (FIG. 17) of this embodiment can be replaced with the voltage control circuit in FIG. 10 (second functional circuit) and the voltage control circuit 3d can be replaced with the voltage control circuit in FIG. 22 (fifth functional circuit).

In the voltage control circuit in FIG. 22, the differential stage 8b has a differential pair of nMOS transistors and a current mirror circuit comprising pMOS transistors as a load. The voltage Vo1 is input to the gate of one of the nMOS transistors in the differential stage 8b and a constant voltage Vmin0 is input to the gate of the other nMOS transistor. The difference between both input terminal voltages, (Vo1−Vmin0), is amplified by the differential stage 8b and the output stage 9a which is comprised of a source follower comprising pMOS transistors and a current source. The amplified voltage is output from the output stage 9a.

When Vo1≧Vmin0, the output terminal voltage Vo2 goes to a high level and is fixed to a high level Vmax1 by the level fixing circuit 10a. When the output terminal voltage Vo2 tends to become higher than Vmax1, the pMOS transistor that is connected to the voltage source Vmax1 and the output terminal (Vo2) works as a switch. As a result, the output terminal voltage Vo2 becomes the fixed voltage Vmax1. The voltage source Vmax1 can be constituted by the voltage supply circuit 11a that uses the current mirror of pMOS transistors. The voltage value of the voltage source 12a is so set that the output voltage of the output terminal 13a of the voltage supply circuit 11a becomes Vmax1. As the voltage source 12a, an ordinary reference voltage generator, which generates a band-gap reference voltage, may be used or a bias voltage may be externally applied.

When Vo1≦Vmin0, on the other hand, the non-inverted, amplified voltage Vo2 of the difference between both input terminal voltages (Vo1−Vmin0) is output. Vmin0 and Vmax1 respectively provide the fixed voltages of Vo1 and Vo2 and correspond to Vmax and Vmin in FIG. 18. The voltage control circuit shown in FIG. 22 can easily be realized by the ordinary low-cost CMOS integrated circuit technology.

The operation of the amplifier circuit (FIG. 17) of this embodiment in the case where it uses the voltage control circuit in FIG. 10 and the voltage control circuit in FIG. 22 vary in accordance with the voltage waveforms in FIG. 18, but the operational waveforms are equivalent to those obtained when the polarity of the current i is inverted and Vo0, Vo1 and Vo2 are inverted between Vmax and Vmin. It is to be noted that Vmax0 and Vmax1 in FIGS. 10 and 22 are equal to Vmax and Vmin0 in FIG. 22 is equal to Vmin.

In this case, the variation range of any of the output terminal voltages Vo0, Vo1 and Vo2 is also restricted to the voltage range between Vmax and Vmin. Although the maximum amplitude of variation is (Vmax−Vmin), the effective variation range of the output voltage Vout is 4(Vmax−Vmin). Apparently, the dynamic range is increased to four times the dynamic range of the conventional amplifier circuit (FIG. 1A). Even if the operational range becomes ¼ due to the reduction in supply voltages, the same dynamic range can be guaranteed.

Fourth Embodiment

Figure 23:
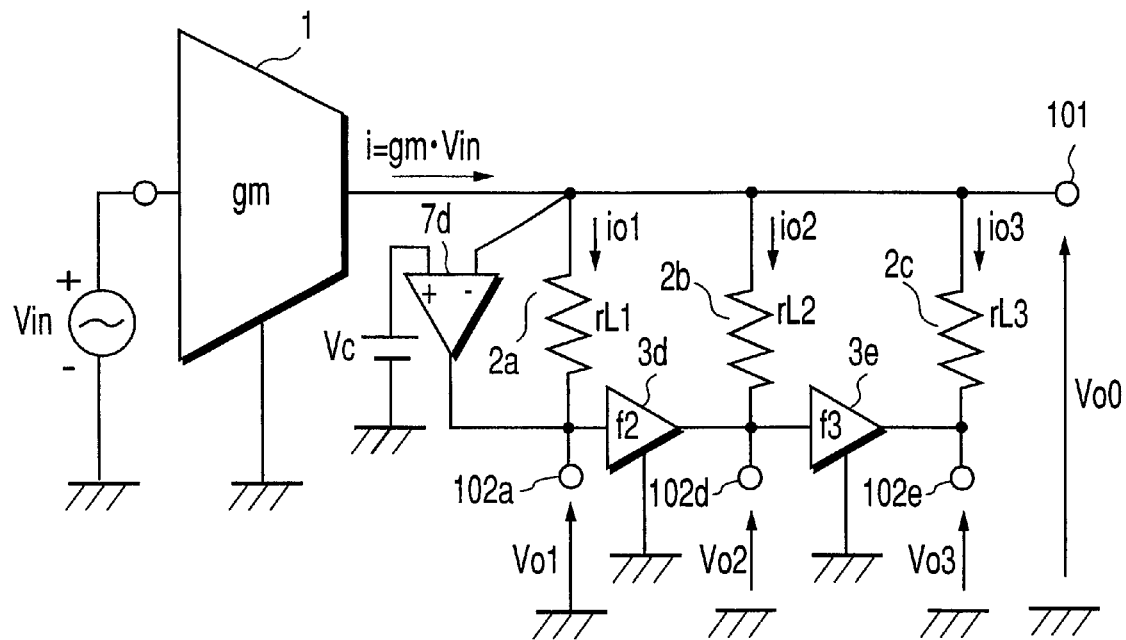
FIG. 23 is a diagram illustrating the structure of an amplifier circuit in a semiconductor integrated circuit according to a fourth embodiment.

FIG. 23 is a diagram illustrating the structure of an amplifier circuit in a semiconductor integrated circuit according to the fourth embodiment of the invention.

One ends of load resistors 2a, 2b and 2c are connected to the output terminal 101 of the OTA 1. A constant voltage Vc is applied to the positive input terminal of an OPA 7d and the output terminal 101 of the OTA 1 is connected to the negative input terminal of the OPA 7d. The output terminal of the OPA 7d is connected to the other end 102a of the load resistor 2a. With the load resistor 2a connected between the input and output terminals of the OPA 7d, the OPA 7d performs a feedback operation so that the voltage Vo0 at its input terminal or at the output terminal 101 of the OTA 1 is virtually grounded. The input terminal and output terminal of the voltage control circuit (third voltage control circuit) 3d are respectively connected to the other ends 102a and 102d of the load resistors 2a and 2b. The input terminal and output terminal of a voltage control circuit (fourth voltage control circuit) 3e are respectively connected to the other ends 102d and 102e of the load resistors 2b and 2c.

Given that the resistances rL1, rL2 and rL3 of the load resistors 2a, 2b and 2c are equal to one another and is denoted by rL, then the following equations 33 to 35 are satisfied.

$$Vo0-Vo1=-Vo1=rL\cdot io1 \tag{33}$$

$$Vo0-Vo2=-Vo2=rL\cdot io2 \tag{34}$$

$$Vo0-Vo3=-Vo3=rL\cdot io3 \tag{35}$$

where the voltages Vo1, Vo2 and Vo3 are the voltages at the other ends 102a, 102d and 102e of the load resistors 2a, 2b and 2c respectively. Using those voltages, the output voltage Vout of the amplifier circuit (FIG. 23) is given by the following equation.

$$\begin{aligned} Vout &= gm\cdot rL\cdot Vin = rL(io1+io2+io3) \\ &= 3Vo0-Vo1-Vo2-Vo3 \\ &= -Vo1-Vo2-Vo3 \end{aligned} \tag{36}$$

Assuming that the voltages Vo1, Vo2 and Vo3 are terminal voltages in the circuit that constitutes the amplifier circuit and take values in the voltage range between the maximum value Vmax and the minimum value Vmin, the voltage range of Vout in the equation 36 becomes as follows.

$$-3\text{ Vmax} \leq \text{Vout} \leq 3\text{Vmin} \tag{37}$$

Therefore, the dynamic range of the output voltage Vout of the amplifier circuit becomes 3 (Vmax−Vmin), which is three times the dynamic range of the conventional amplifier circuit (FIG. 1A). Even if the operational range is reduced to ⅓ due to the reduction in supply voltages, it is possible to guarantee the same dynamic range.

Figure 24:
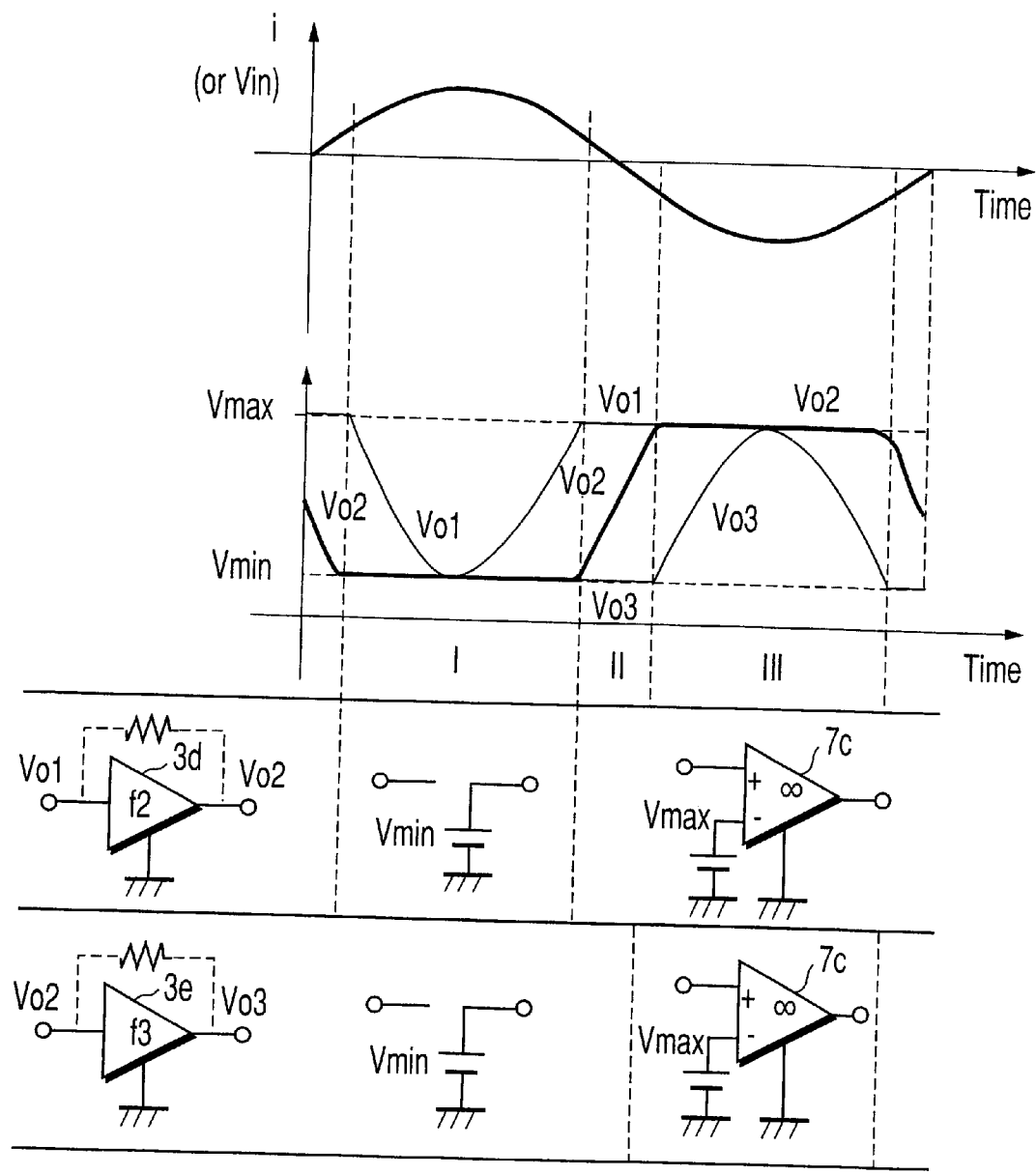
FIG. 24 is a diagram depicting the operation of a voltage control circuit used in the amplifier circuit in FIG. 23.

FIG. 24 illustrates the operation of the voltage control circuits 3d and 3e used in the amplifier circuit (FIG. 23) according to this embodiment.

When the input terminal voltage Vo1 is lower than the constant voltage Vmax, the input of the voltage control circuit 3d is opened and the output is fixed to the constant voltage Vmin. When the input terminal voltage Vo1 is higher than Vmax, the voltage control circuit 3d works as the OPA 7c that has an infinite input impedance and gain. Likewise, when the input terminal voltage Vo2 is lower than Vmax, the input of the voltage control circuit 3e is opened and the output is fixed to Vmin, and when Vo2 is higher than Vmax, the voltage control circuit 3e works as the OPA 7c. Accordingly, the terminal voltages Vo1, Vo2 and Vo3 of the amplifier circuit (FIG. 23) have voltage waveforms shown in FIG. 24 in accordance with the operations of the voltage control circuits 3d and 3e.

FIG. 24 shows the middle voltage (Vmax+Vmin)/2 between Vmax and Vmin as Vc (=0), so that when the input voltage Vin of the amplifier circuit is 0 and the current i is 0, the output voltage Vout (=−Vo1−Vo2−Vo3) becomes Vc or 0.

In the period I, Vo1 varies and Vo2 and Vo3 are fixed to Vmin. The currents io1, io2 and io3 that are given by the following equations 38 to 40 respectively flow across the load resistors 2a, 2b and 2c in FIG. 23 while satisfying i=io1+io2+io3. It is to be noted however that Vc=(Vmax+Vmin)/2=0 and Vo0 is virtually fixed to Vc or 0.

$$\begin{aligned} io1 &= (Vo0-Vo1)/rL1 \\ &= (Vc-Vo1)/rL1 \end{aligned} \tag{38}$$

$$\begin{aligned} io2 &= (Vo0-Vmin)/rL2 \\ &= (Vc-Vmin)/rL2 \end{aligned} \tag{39}$$

$$\begin{aligned} io3 &= (Vo0-Vmin)/rL3 \\ &= (Vc-Vmin)/rL3 \end{aligned} \tag{40}$$

Suppose that the voltage Vo1 has reached Vmin as shown in FIG. 24 when the voltage Vin or the current i reached a positive peak value. As the current i is given by an equation 41, the maximum value of the output voltage Vout is acquired from an equation 42.

$$\begin{aligned} i &= gm\cdot Vin = io1+io2+io3 \\ &= Vc(1/rL1+1/rL2+1/rL3) - \\ &\quad Vo1/rL1-Vmin/rL2-Vmin/rL3 \\ &= -Vmin(1/rL1+1/rL2+1/rL3) \\ &= -Vmin(3/rL) \end{aligned} \tag{41}$$

$$\begin{aligned} Vout &= i\cdot rL = gm\cdot rL\cdot Vin \\ &= -3Vmin \end{aligned} \tag{42}$$

where rL1=rL2=rL3=rL.

In the period II, when the voltage Vo1 tends to go higher than Vmax, the voltage variation of Vo2 appears at the output terminal 102d due to the amplification action of the OPA 7c in the voltage control circuit 3d. The input terminal voltage Vo1 of the voltage control circuit 3d is fixed to Vmax by the feedback operation of the circuit system and the output terminal voltage Vo3 of the voltage control circuit 3e is fixed to Vmin by the operation of the voltage control circuit 3e. The voltage Vo0 at the output terminal 102 of the amplifier circuit is virtually fixed to Vc (=0) by the feedback operation of the OPA 7d. Therefore, the currents io1 and io3 become constant so that the variable current io2 according to the voltage Vin or the current i flows across the load resistor 2b. The current io2 is supplied from the output terminal of the OPA 7c in the voltage control circuit 3d. The currents io1, io2 and io3 that respectively flow across the load resistors 2a, 2b and 2c are given by the following equations.

$$\begin{aligned} io1 &= (Vo0-Vmax)/rL1 \\ &= (Vc-Vmax)/rL1 \end{aligned} \tag{43}$$

$$\begin{aligned} io2 &= (Vo0-Vo2)/rL2 \\ &= (Vc-Vo2)/rL2 \end{aligned} \tag{44}$$

$$\begin{aligned} io3 &= (Vo0-Vo3)/rL3 \\ &= (Vc-Vmin)/rL3 \end{aligned} \tag{45}$$

Substituting those equations in $$i=gm\cdot Vin=io1+io2+io3$$

yields $$i = Vc(1/rL1 + 1/rL2 + 1/rL3) - \qquad (46)$$
$$Vo2/rL2 - Vmax/rL1 - Vmin/rL3$$
$$= -Vo2/rL - (Vmax + Vmin)/rL$$
$$= -Vo2/rL$$

Thus, the output voltage Vout is given by the following equation.

$$Vout = gm \cdot rL \cdot Vin \qquad (47)$$
$$= i \cdot rL = -Vo2$$

where rL=rL1=rL2=rL3. When the voltage Vin and the current i are 0, the voltage Vo2 becomes the middle voltage Vc between Vmax and Vmin or 0 as indicated by the voltage waveforms in FIG. 24. Thus, the output voltage Vout becomes 0.

When the voltage Vo2 tends to go higher than Vmax in the period III, the variable voltage Vo3 appears at the output terminal 102e due to the amplification operation of the OPA 7c in the voltage control circuit 3e. At this time, the input voltage Vo2 of the voltage control circuit 3e is fixed to Vmax by the feedback operation of the circuit system and the input voltage Vo1 of the voltage control circuit 3d is also fixed to Vmax by the feedback operation of the circuit system.

As the voltage Vo0 at the output terminal 101 is virtually fixed to Vc (=0) by the feedback operation of the OPA 7d, the currents io1 and io2 become constant so that the variable current io3 according to the voltage Vin or the current i flows across the load resistor 2c. The current io3 is supplied from the output terminal of the OPA 7c of the voltage control circuit 3e. The currents io1, io2 and io3 that respectively flow across the load resistors 2a, 2b and 2c are given by the following equations.

$$io1 = (Vo0 - Vmax)/rL1 \qquad (48)$$
$$= (Vc - Vmax)/rL1$$
$$io2 = (Vo0 - Vmax)/rL2 \qquad (49)$$
$$= (Vc - Vmax)/rL2$$
$$io3 = (Vo0 - Vo3)/rL3 \qquad (50)$$
$$= (Vc - Vo3)/rL3$$

Suppose now that Vo3 has reached Vmax as shown in FIG. 24 when the voltage Vin or the current i reached a negative peak value. As the current is given by the following equation 51, the minimum value of the output voltage Vout is acquired from the following equation 52.

$$i = gm \cdot Vin = io1 + io2 + io3 \qquad (51)$$
$$= Vc(1/rL1 + 1/rL2 + 1/rL3) -$$
$$Vmax/rL1 - Vmax/rL2 - Vo3/rL3$$
$$= -Vmax(3/rL)$$
$$Vout = i \cdot rL = gm \cdot rL \cdot Vin \qquad (52)$$
$$= -3Vmax$$

where rL=rL1=rL2=rL3.

It is apparent from the equations 42 and 52 that the dynamic range of the output voltage Vout (=gm·rL·Vin) of the amplifier circuit (FIG. 23) becomes 3(Vmax−Vmin) which is three times the dynamic range of the conventional amplifier circuit (FIG. 1A).

The voltage control circuits 3d and 3e used in the amplifier circuit (FIG. 23) of this embodiment can employ the structure of the voltage control circuit 3d (FIG. 19) used in the amplifier circuit (FIG. 17) of the third embodiment. The operations of the voltage control circuits 3d and 3e are the same as that of the voltage control circuit in FIG. 19.

Figure 25:
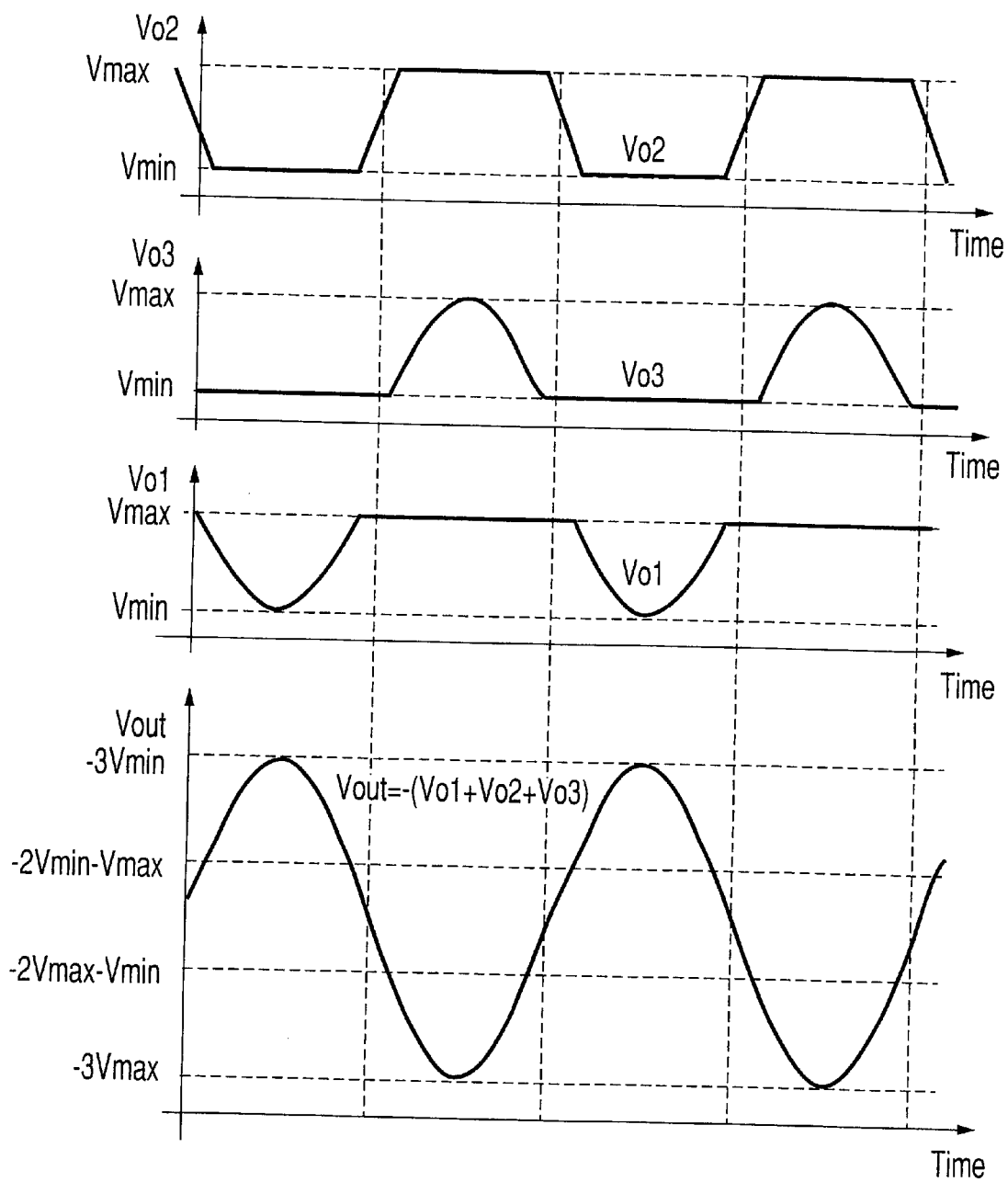
FIG. 25 is a diagram showing individual voltage waveforms of an amplifier circuit which uses the voltage control circuit in FIG. 24.

FIG. 25 shows the individual voltage waveforms of the amplifier circuit (FIG. 23) of this embodiment which uses the voltage control circuits 3d and 3e.

The voltage Vo0 is virtually grounded to Vc (=0) and the output voltage Vout is the sum of Vo1, Vo2 and Vo3. The variation range of any of the output terminal voltages Vo1, Vo2 and Vo3 is also restricted to the voltage range between Vmax and Vmin. Although the maximum amplitude of variation is (Vmax−Vmin), the effective variation range of the output voltage Vout is 3 (Vmax−Vmin). Apparently, the dynamic range is increased to three times the dynamic range of the conventional amplifier circuit (FIG. 1A). Even if the operational range becomes ⅓ due to the reduction in supply voltages, the same dynamic range can be guaranteed. The output voltage Vout of the amplifier circuit (FIG. 23) is obtained by simple addition of the output terminal voltages Vo1, Vo2 and Vo3, the amplifier circuit is effective in signal processing and useful in the construction of the circuit that performs signal processing.

In the amplifier circuit (FIG. 23) in a semiconductor integrated circuit according to this embodiment, the voltage control circuits 3d and 3e can be replaced with the voltage control circuit shown in FIG. 22. In this case, Vmin0 and Vmax1 in FIG. 22 should be treated as equal to Vmin and Vmax and Vc should be the middle voltage between Vmax and Vmin. The operational waveforms of the amplifier circuit conform to those shown in FIG. 24 and are equivalent to the operational waveforms obtained when the polarity of the current i is inverted and Vo1, Vo2 and Vo3 are inverted between Vmax and Vmin.

In this case too, the variation range of any of the output terminal voltages Vo1, Vo2 and Vo3 is limited to the voltage range between Vmax and Vmin. Although the maximum amplitude of variation is (Vmax−Vmin), the effective variation range of the output voltage Vout is 3(Vmax−Vmin). Apparently, the dynamic range is increased to three times the dynamic range of the conventional amplifier circuit (FIG. 1A). Even if the operational range becomes ⅓ due to the reduction in supply voltages, the same dynamic range can be guaranteed.

An inverting operational amplifier as shown in FIG. 12 or an inverter may be used in place of the OPA 7d in the amplifier circuit (FIG. 23) for a semiconductor integrated circuit according to this embodiment. The threshold voltage Vm of an inverting operational amplifier or an inverter should be set equal to the input bias voltage Vc of the OPA 7d. The operation of the amplifier circuit in this case can be explained using the voltage waveforms in FIGS. 24 and 25. Although the voltage Vo0 is not fixed to Vc or Vm, the output terminal voltages Vo1, Vo2 and Vo3 vary within the voltage range between Vmax and Vmin as they do in FIGS. 24 and 25. This can ensure a broad dynamic range for the output voltage Vout.

Fifth Embodiment

Figure 26:
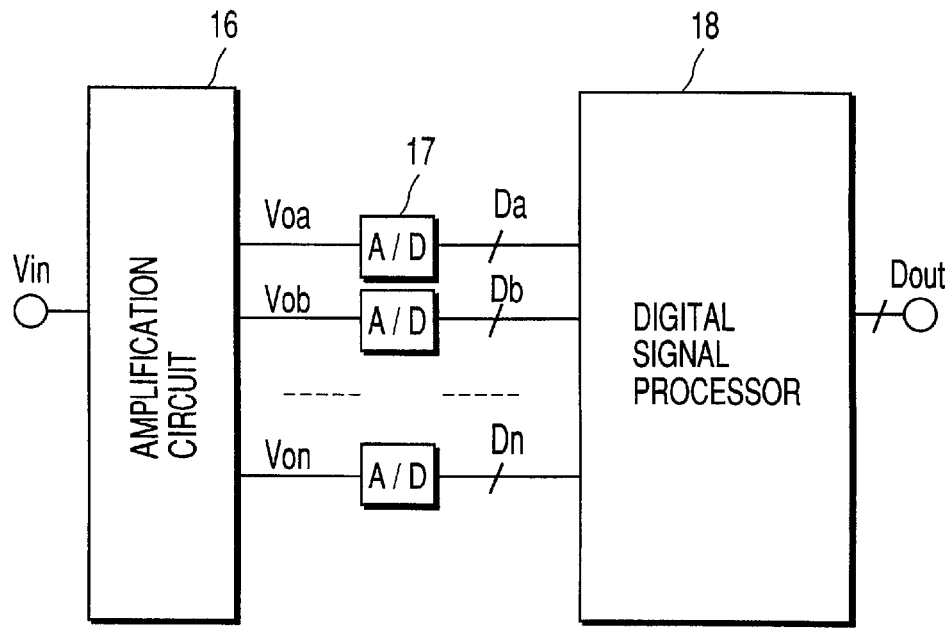
FIG. 26 is a diagram illustrating a semiconductor integrated circuit according to a fifth embodiment, which performs A/D conversion of the output of an amplifier circuit before executing digital signal processing.

FIG. 26 is a diagram for explaining a semiconductor integrated circuit according to the fifth embodiment of this invention and exemplifies the circuit that performs A/D conversion of the output of an amplifier circuit before executing digital signal processing.

The amplifier circuit according to any one of the first to fourth embodiments is used as an amplifier circuit 16. Voa, Vob and so forth represent analog signals of the output terminal voltages Vo0, Vo1 and so forth of the amplifier circuit 16. An A/D converter 17 converts the analog signals Voa, Vob and so forth to digital signals Da, Db and so forth. The digital signals Da, Db and so forth are processed in a digital signal processor 18 which outputs digital data Dout. The input signals Voa, Vob and so forth to the A/D converter 17 are made to fall within a given low voltage range by the amplifier circuit 16 of this embodiment.

As the input voltage range of the A/D converter 17 does not become broad, the A/D converter 17 is suitable as an integrated circuit operable on low supply voltages. It is therefore possible to design all the amplifier circuit 16, A/D converter 17 and digital signal processor 18 with CMOS integrated circuits on the same chip. Further, the amplifier circuit 16, A/D converter 17 and digital signal processor 18 are well adaptable to reduction of the supply voltages.

Sixth Embodiment

Figure 27:
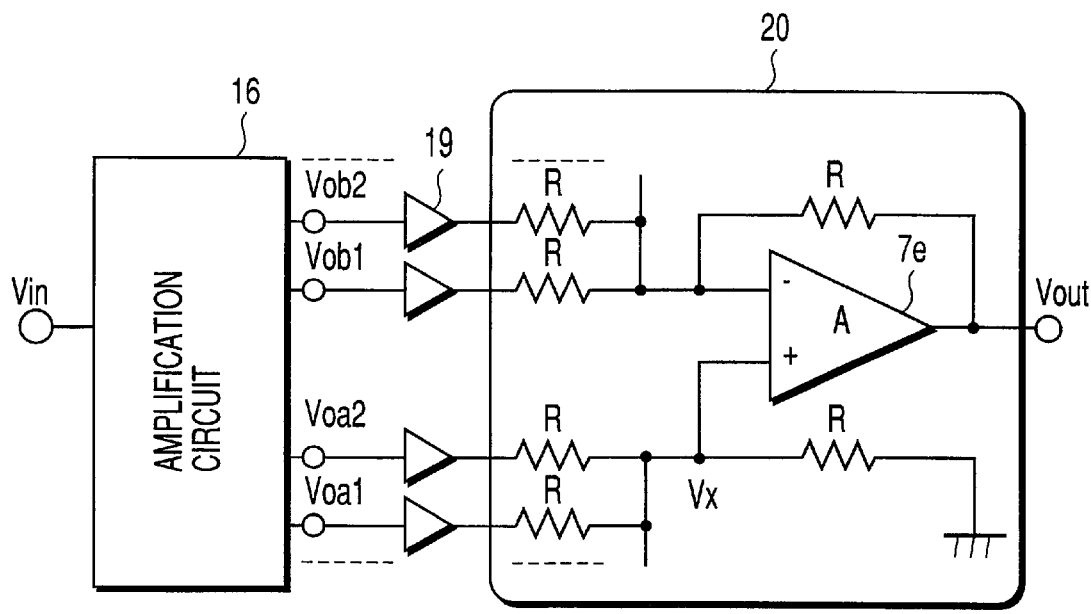
FIG. 27 is a diagram illustrating a semiconductor integrated circuit according to a sixth embodiment that includes an operational amplifier which performs an operation on the output of an amplifier circuit.

FIG. 27 is a diagram for explaining a semiconductor integrated circuit according to the sixth embodiment of the invention and exemplifies the structure of a circuit which performs an operation on the output of an amplifier circuit.

The amplifier circuit according to any one of the first to fourth embodiments is used as the amplifier circuit 16. The output voltage Vout of the amplifier circuit 16 is generally acquired by linear computation of the individual output voltages Vo0, Vo1, Vo2, Vo3, etc. The individual output terminal voltages appear at output terminals Voa1, Voa2, . . . and Vob1, Vob2, . . . of the amplifier circuit 16 in FIG. 27 and are input to an operational amplifier 20 which uses an OPA 7e via a voltage follower 19. The output voltage Vout that is given by the following equation is acquired by the operational amplifier 20.

$$Vout = (Voa1 + Voa2 + \ldots) - (Vob1 + Vob2 + \ldots) \quad (53)$$

Vout corresponds to the output voltage Vout of the amplifier circuit for a semiconductor integrated circuit according to any one of the first to fourth embodiments and has a wide dynamic range.

As apparent from the foregoing detailed description, this invention can allow the ordinary CMOS integrated circuit technology to provide an amplifier circuit with a wide dynamic range which performs analog signal processing even on low supply voltages. This contributes to the system-on-chip implementation in the state-of-the-art LSI circuit technology using microminiaturization process. The invention is adaptable to small battery-operable devices such as portable information terminals and is significantly advantageous over the prior art.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
an amplifier circuit including a current output amplifier configured to covert an input signal to a current signal, a load resistor having a first end connected to an output terminal of said current output amplifier and a second end, and a voltage control circuit having an input terminal connected to said first end of said load resistor and an output terminal connected to said second end of said load resistor, said amplifier circuit having an input terminal serving as an input terminal of said current output amplifier and output terminals serving as said first and second ends of said load resistor.

2. The semiconductor integrated circuit according to claim 1, wherein said voltage control circuit is constituted by a functional circuit which fixes an output voltage to a preset first constant voltage when an input voltage is higher than said first constant voltage and operates as an inverting operational amplifier when said input voltage is lower than said first constant voltage.

3. The semiconductor integrated circuit according to claim 1, wherein said voltage control circuit is constituted by a functional circuit which fixes an output voltage to a preset constant voltage when an input voltage is lower than said constant voltage and operates as an inverting operational amplifier when said input voltage is higher than said constant voltage.

4. The semiconductor integrated circuit according to claim 1, wherein said voltage control circuit is constituted by a functional circuit which operates as an inverting operational amplifier.

5. A semiconductor integrated circuit comprising:
an amplifier circuit including a current output amplifier configured to convert an input signal to a current signal, a first resistor having a first end connected to an output terminal of said current output amplifier and a second end, a first voltage control circuit having an input terminal connected to said first end of said first resistor, a second resistor having a first end connected to said output terminal of said current output amplifier and a second end, and a second voltage control circuit having an input terminal connected to said first end of said second resistor and an output terminal connected to said second end of said second resistor, said amplifier circuit having an input terminal serving as an input terminal of said current output amplifier and output terminals serving as said output terminal of said current output amplifier and said second ends of said first and second resistors.

6. The semiconductor integrated circuit according to claim 5, wherein said first voltage control circuit is constituted by a first functional circuit which fixes an output voltage to a preset first constant voltage when an input voltage is higher than said first constant voltage and operates as an inverting operational amplifier when said input voltage is lower than said first constant voltage; and said second voltage control circuit is constituted by a second functional circuit which fixes said output voltage to a preset second constant voltage higher than said first constant voltage when said input voltage is lower than said second constant voltage and operates as an inverting operational amplifier when said input voltage is higher than said second constant voltage.

7. A semiconductor integrated circuit comprising:
an amplifier circuit including a current output amplifier configured to convert an input signal to a current signal, a first resistor having a first end connected to an output terminal of said current output amplifier, a first voltage control circuit having an input terminal connected to said first end of said first resistor and a second end, a second resistor having a first end connected to said output terminal of said current output amplifier and a second end, and a second voltage control circuit having an input terminal connected to said second end of said first resistor and an output terminal connected to said second end of said second resistor, said amplifier circuit having an input terminal serving as an input terminal of said current output amplifier and output terminals serving as said output terminal of said current output amplifier and said second ends of said first and second resistors.

8. The semiconductor integrated circuit according to claim 7, wherein said first voltage control circuit is constituted by a first functional circuit which fixes an output voltage to a preset first constant voltage when an input voltage is higher than said first constant voltage and operates as an inverting operational amplifier when said input voltage is lower than said first constant voltage; and said second voltage control circuit is constituted by a second functional circuit which fixes said output voltage to said first constant voltage when said input voltage is lower than a preset second constant voltage higher than said first constant voltage and operates as a non-inverting operational amplifier when said input voltage is higher than said second constant voltage.

9. The semiconductor integrated circuit according to claim 7, wherein said first voltage control circuit is constituted by a first functional circuit which fixes an output voltage to a preset second constant voltage when an input voltage is lower than said second constant voltage and operates as an inverting operational amplifier when said input voltage is higher than said second constant voltage; and said second voltage control circuit is constituted by a second functional circuit which fixes said output voltage to said second constant voltage when said input voltage is higher than a preset first constant voltage lower than said second constant voltage and operates as a non-inverting operational amplifier when said input voltage is lower than said first constant voltage.

10. A semiconductor integrated circuit comprising:

an amplifier circuit including a current output amplifier configured to covert an input signal to a current signal, a first resistor having a first end connected to an output terminal of said current output amplifier and a second end, a differential operational amplifier having a positive input terminal applied with a constant voltage, a negative input terminal connected to said first end of said first resistor and an output terminal connected to said second end of said first resistor, a second resistor having a first end connected to said output terminal of said current output amplifier and a second end, and a first voltage control circuit having an input terminal connected to said second end of said first resistor and an output terminal connected to said second end of said second resistor, said amplifier circuit having an input terminal serving as an input terminal of said current output amplifier and output terminals serving as said output terminal of said current output amplifier and said second ends of said first and second resistors.

11. The semiconductor integrated circuit according to claim 10, wherein said voltage control circuit is constituted by a functional circuit which fixes an output voltage to a preset first constant voltage when an input voltage is lower than a preset second constant voltage higher than said first constant voltage and operates as a non-inverting operational amplifier when said input voltage is higher than said second constant voltage.

12. The semiconductor integrated circuit according to claim 10, wherein said voltage control circuit is constituted by a functional circuit which fixes an output voltage to a preset second constant voltage when an input voltage is higher than a preset first constant voltage lower than said second constant voltage and operates as a non-inverting operational amplifier when said input voltage is lower than said first constant voltage.

13. The semiconductor integrated circuit according to claim 10, further comprising a third resistor having a first end connected to said output terminal of said current output amplifier and a second end, and a second voltage control circuit having an input terminal connected to said second end of said second resistor and an output terminal connected to said second end of said third resistor, and wherein said output terminal of said current output amplifier, said second ends of said first and second resistors and said second end of said third resistor serve as an output terminal of said amplifier circuit.

14. The semiconductor integrated circuit according to claim 13, wherein said first and second voltage control circuits are constituted by a functional circuit which fixes an output voltage to a preset first constant voltage when an input voltage is lower than a preset second constant voltage higher than said first constant voltage and operates as a non-inverting operational amplifier when said input voltage is higher than said second constant voltage.

15. The semiconductor integrated circuit according to claim 13, wherein said first and second voltage control circuits are constituted by a functional circuit which fixes an output voltage to a preset second constant voltage when an input voltage is higher than a preset first constant voltage lower than said second constant voltage and operates as a non-inverting operational amplifier when said input voltage is lower than said first constant voltage.

16. The semiconductor integrated circuit according to claim 10, wherein said differential operational amplifier is consisted by a functional circuit which operates as an inverting operational amplifier.

17. The semiconductor integrated circuit according to claim 2, wherein said first functional circuit is constituted by an operational amplifier comprising a differential stage for applying an input voltage to one of a pair of differential inputs formed by a pair of MOS transistors of a first channel, supplies said first constant voltage to the other differential input and has a pair of MOS transistors of a second channel opposite to said first channel as a load, an output stage comprising a source follower comprised of an MOS transistor of said first channel and a load, and a circuit, connected to an output terminal of said output stage, for fixing a voltage at said output terminal of said output stage to said first constant voltage when that voltage is lower than said first constant voltage; and an inverted signal of said input voltage to said operational amplifier is output to said output terminal of said output stage.

18. The semiconductor integrated circuit according to claim 3, wherein said second functional circuit is constituted by an operational amplifier comprising a differential stage for applying an input voltage to one of a pair of differential inputs formed by a pair of MOS transistors of a first channel, supplies said second constant voltage to the other differential input and has a pair of MOS transistors of a second channel opposite to said first channel as a load, an output stage comprising a source follower comprised of an MOS transistor of said second channel and a load, and a circuit, connected to an output terminal of said output stage, for fixing a voltage at said output terminal of said output stage to said second constant voltage when that voltage is higher than said second constant voltage; and an inverted signal of said input voltage to said operational amplifier is output to said output terminal of said output stage.

19. The semiconductor integrated circuit according to claim 4, wherein said third functional circuit is constituted by an inverting operational amplifier formed by connecting an input resistor and a feedback resistor to an operational amplifier and a voltage follower connected to an input terminal of said inverting operational amplifier, and an input terminal of said third functional circuit serves as an input terminal of said voltage follower and an output terminal of said third functional circuit serves as an output terminal of said inverting operational amplifier.

20. The semiconductor integrated circuit according to claim 4, wherein said third functional circuit is constituted by an inverter comprising MOS transistors.

21. The semiconductor integrated circuit according to claim 8, wherein said second functional circuit is constituted by an operational amplifier comprising a differential stage for applying an input voltage to one of a pair of differential inputs formed by a pair of MOS transistors of a first channel, supplies said second constant voltage to the other differential input and has a pair of MOS transistors of a second channel opposite to said first channel as a load, an output stage comprising a source follower comprised of an MOS transistor of said first channel and a load, and a circuit, connected to an output terminal of said output stage, for fixing a voltage at said output terminal of said output stage to said first constant voltage when that voltage is lower than said first constant voltage; and a non-inverted signal of said input voltage to said operational amplifier is output to said output terminal of said output stage.

22. The semiconductor integrated circuit according to claim 9, wherein said second functional circuit is constituted by an operational amplifier comprising a differential stage for applying an input voltage to one of a pair of differential inputs formed by a pair of MOS transistors of a first channel, supplies said first constant voltage to the other differential input and has a pair of MOS transistors of a second channel opposite to said first channel as a load, an output stage comprising a source follower comprised of an MOS transistor of said second channel and a load, and a circuit, connected to an output terminal of said output stage, for fixing a voltage at said output terminal of said output stage to said second constant voltage when that voltage is higher than said second constant voltage; and a non-inverted signal of said input voltage to said operational amplifier is output to said output terminal of said output stage.

23. The semiconductor integrated circuit according to claim 1, wherein the individual output terminals of said amplifier circuit are connected to an A/D converter formed on the same semiconductor integrated circuit.

* * * * *